(12) United States Patent
Aggarwal et al.

(10) Patent No.: US 12,197,023 B1
(45) Date of Patent: Jan. 14, 2025

(54) MANUFACTURING OPTICALLY ACCESSIBLE CO-PACKAGED OPTICS

(71) Applicant: Celestial AI Inc., Santa Clara, CA (US)

(72) Inventors: Ankur Aggarwal, Pleasanton, CA (US); Subal Sahni, La Jolla, CA (US); Philip Winterbottom, San Jose, CA (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 18/660,824

(22) Filed: May 10, 2024

Related U.S. Application Data

(60) Provisional application No. 63/579,486, filed on Aug. 29, 2023.

(51) Int. Cl.
    *G02B 6/42* (2006.01)
    *H01L 23/00* (2006.01)
    (Continued)

(52) U.S. Cl.
    CPC .......... *G02B 6/425* (2013.01); *G02B 6/4213* (2013.01); *H01L 24/32* (2013.01); *H01L 25/18* (2013.01); *H01L 25/50* (2013.01); *H01L 24/13* (2013.01); *H01L 24/16* (2013.01); *H01L 2224/13147* (2013.01); *H01L 2224/16145* (2013.01); *H01L 2224/32225* (2013.01);
    (Continued)

(58) Field of Classification Search
    CPC .. G02B 6/12002; G02B 6/425; G02B 6/4213; H01L 25/167; H01L 24/32; H01L 24/13; H01L 24/16; H01L 25/18; H01L 25/50; H01L 2224/13147; H01L 2224/16145; H01L 2224/32225; H01L 2924/1431; H01L 2924/1432; H01L 2924/1433; H01L 2924/1436; H01L 2924/1437; H01L 2924/1438; H01L 2924/1443; H05K 1/0274
    See application file for complete search history.

(56) References Cited

U.S. PATENT DOCUMENTS 9,041,015 B2 * 5/2015 Lai ..................... G02B 6/12004
                                                          257/81
9,335,473 B2 * 5/2016 Lai ........................... G02B 6/42
(Continued)

OTHER PUBLICATIONS

Tekin, Tolga. (2011). Review of Packaging of Optoelectronic, Photonic, and MEMS Components. Selected Topics in Quantum Electronics, IEEE Journal of. 17. 704-719. 10.1109/JSTQE.2011. 2113171. (Year: 2011).*

*Primary Examiner* — Peter Radkowski
(74) *Attorney, Agent, or Firm* — Fish & Richardson P.C.

(57) ABSTRACT

The present disclosure relates to circuit package implementations. The circuit package includes a PIC that allows for the transmission of data photonically between hardware coupled to the PIC. The circuit package further includes one or more spacers that are positioned above the PIC in a manner that allows light to pass through an optical path between the top surface of the circuit package and the PIC. Different spacers can be added to the package at different stages of the manufacturing process such that the optical path is maintained through the manufacturing of the circuit package. The circuit package having the optically accessible PIC may be implemented within the framework of a microelectronic package.

29 Claims, 21 Drawing Sheets

(51) Int. Cl.
H01L 25/00 (2006.01)
H01L 25/18 (2023.01)

(52) U.S. Cl.
CPC ............. *H01L 2924/1431* (2013.01); *H01L 2924/1432* (2013.01); *H01L 2924/1433* (2013.01); *H01L 2924/1436* (2013.01); *H01L 2924/1437* (2013.01); *H01L 2924/1438* (2013.01); *H01L 2924/1443* (2013.01)

(56) References Cited

U.S. PATENT DOCUMENTS

| | | | |
|---|---|---|---|
| 9,678,271 B2 * | 6/2017 | Thacker | G02B 6/4219 |
| 10,043,787 B2 * | 8/2018 | Tokunari | H01L 25/167 |
| 10,261,248 B2 * | 4/2019 | Lai | H01S 5/02355 |
| 10,418,351 B2 * | 9/2019 | Tokunari | H01L 31/02002 |
| 10,527,788 B2 * | 1/2020 | Lai | H01S 5/02355 |
| 10,551,577 B2 * | 2/2020 | Seyedi | G02B 6/124 |
| 10,663,680 B2 * | 5/2020 | Mahgerefteh | G02B 6/34 |
| 11,525,915 B2 * | 12/2022 | Russo | G01S 7/4815 |
| 11,835,777 B2 | 12/2023 | Winterbottom et al. | |
| 2007/0085215 A1 * | 4/2007 | Budd | G02B 6/43 |
| | | | 257/778 |
| 2014/0269804 A1 * | 9/2014 | Lai | G02B 6/4206 |
| | | | 372/50.21 |
| 2015/0212270 A1 * | 7/2015 | Lai | G02B 6/12002 |
| | | | 438/25 |
| 2016/0131842 A1 * | 5/2016 | Mahgerefteh | G02B 6/136 |
| | | | 385/11 |
| 2016/0216445 A1 * | 7/2016 | Thacker | G02B 6/4219 |
| 2016/0238793 A1 * | 8/2016 | Frankel | G02B 6/14 |
| 2016/0245998 A1 * | 8/2016 | Lai | G02B 6/42 |
| 2017/0315299 A1 * | 11/2017 | Mathai | G02B 6/34 |
| 2018/0197842 A1 * | 7/2018 | Tokunari | H01L 25/167 |
| 2018/0227549 A1 * | 8/2018 | Cai | H04N 25/75 |
| 2018/0269193 A1 * | 9/2018 | Tokunari | H01S 5/0235 |
| 2019/0004247 A1 * | 1/2019 | Huang | G02B 6/4214 |
| 2019/0219762 A1 * | 7/2019 | Lai | G02B 6/1221 |
| 2019/0293878 A1 * | 9/2019 | Mahgerefteh | H01S 5/02326 |
| 2020/0217961 A1 * | 7/2020 | Russo | G01S 7/4918 |
| 2020/0411587 A1 * | 12/2020 | Pezeshki | G02B 6/4214 |
| 2022/0260775 A1 | 8/2022 | Bruck et al. | |
| 2022/0342164 A1 | 10/2022 | Chen et al. | |
| 2022/0365295 A1 * | 11/2022 | Jiang | H01L 24/17 |
| 2024/0038657 A1 | 2/2024 | Aggarwal et al. | |

* cited by examiner (INTRA-PACKAGE)

(INTER-PACKAGE)

ical integrated circuits (EICs), such as processing units and other application specific integrated circuits (ASICs), to provide packages that use a combination of electrical and optical signals to communicate and process data. In many designs, a photonic integrated circuit (PIC) is used to communicate optical data within a package and optical fibers are commonly used to relay optical data between packages. An optical interface, e.g., for receiving a pluggable module, is used to facilitate connecting an end of an optical fiber to a package. Such interfaces can couple light from the fiber into a waveguide in a PIC via a port on the surface of the PIC of at an edge of the PIC. In either case, arrangement of components in a package should provide ample access to the PIC to accommodate the optical interface for robust and reliable attachment of the optical fiber(s).

MANUFACTURING OPTICALLY ACCESSIBLE CO-PACKAGED OPTICS

CROSS-REFERENCE TO RELATED APPLICATIONS

This application claims priority to U.S. Provisional Patent Application No. 63/579,486, entitled "OPTICALLY ACCESSIBLE PHOTONIC BRIDGE PACKAGE", filed on Aug. 29, 2023, the entirety of which is incorporated herein by reference.

BACKGROUND OF THE DISCLOSURE

Co-packaged optics refers to the integration of optical components directly with electrical integrated circuits (EICs), such as processing units and other application specific integrated circuits (ASICs), to provide packages that use a combination of electrical and optical signals to communicate and process data. In many designs, a photonic integrated circuit (PIC) is used to communicate optical data within a package and optical fibers are commonly used to relay optical data between packages. An optical interface, e.g., for receiving a pluggable module, is used to facilitate connecting an end of an optical fiber to a package. Such interfaces can couple light from the fiber into a waveguide in a PIC via a port on the surface of the PIC of at an edge of the PIC. In either case, arrangement of components in a package should provide ample access to the PIC to accommodate the optical interface for robust and reliable attachment of the optical fiber(s).

DETAILED DESCRIPTION

The present disclosure relates to circuit packages with optically accessible co-packaged optics and methods for making such packages. Indeed, implementations herein relate to improving off-chip photonic links, e.g., bidirectional photonic links, by providing a transparent spacer over optical couplers in the surface of a PIC that couple light into waveguides in the PIC. Such spacers can facilitate access to the waveguides through openings that are smaller than the optical interfaces typically used to couple optical fibers to a PIC and/or facilitate access to optical couplers that are close to other components in a package that includes the PIC.

As will be discussed in further detail below, examples described herein include circuit packages with co-packaged optics that include an optical path between an active element, e.g., a photodetector or modulator, in a photonic integrated circuit (PIC) and an optical interface, e.g., a fiber array unit (FAU), that connects to an optical fiber.

Conventional circuit packages that include a PIC can be difficult and costly to manufacture because the optical interface is a relatively large component (e.g., similar in dimensions to the PIC) and needs to be robustly and precisely attached to the PIC to ensure reliable alignment between the optical fiber(s) and the coupler(s) through which optical signals are transmitted to and from the PIC.

One approach to managing these constraints when attaching an EIC to the PIC surface is to use an EIC die which is physically smaller in at least one dimension than the PIC. This ensures at least a portion of the PIC surface is clear of the EIC. Waveguides in the PIC can be routed to couplers in this portion and the optical interface can be attached to the exposed surface, however this manufacturing step can be difficult. Moreover, such optical interface attachment often takes place after EIC attachment so any yield loss due to faulty interface attachment results in a loss of both the PIC and the EIC (often the most expensive part of a package). Indeed, packaging often involves encapsulating components with a packaging compound, e.g., an epoxy, that is injection molded at high pressure. Maintaining precise alignment of an optical interface to a PIC during such a process can be challenging and can create impediments to economical mass production of such packages.

Figure 1:
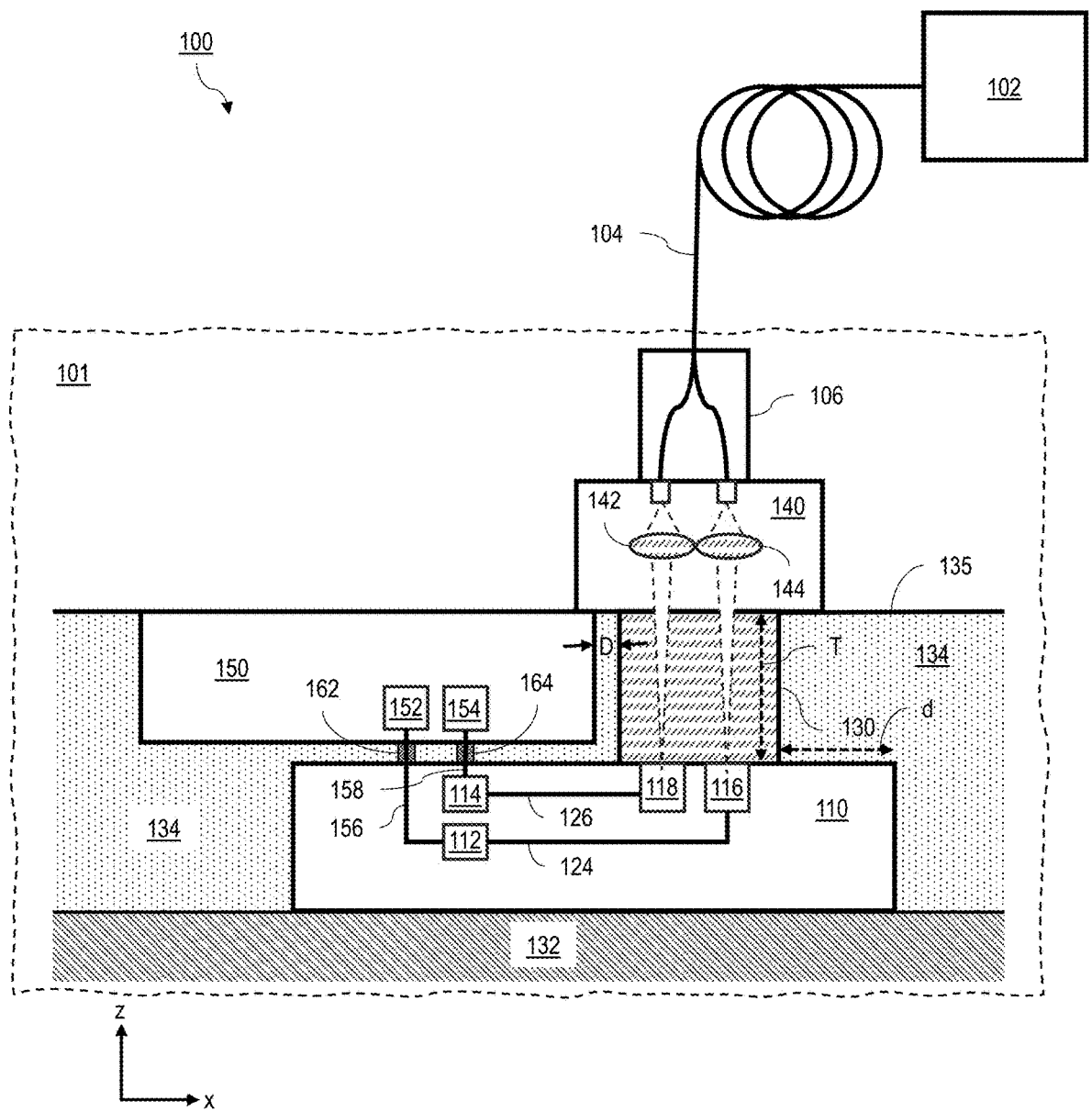
FIG. 1 is a schematic cross-sectional view of an example system that includes a circuit package with co-packaged optics.

Referring to FIG. 1, a system 100 includes a circuit package 101 connected by a bundle of optical fibers 104 to another component 102, e.g., a light source or another circuit package. The circuit package 101, only a portion of which is shown, includes a PIC 110, an EIC 150, a spacer 130, an optical interface 140, and a base 132. A molding compound 134 at least partially encapsulates the PIC 110, the EIC 150, and the spacer 130 against the base 132. Together, the EIC 150, the spacer 130, and the molding compound 134 provide a continuous, flat surface 135 on which the optical interface 140 is mounted. FIG. 1 also shows a Cartesian coordinate system, for ease of reference. The z-direction may be referred to as the vertical direction while the x-direction and y-direction are lateral directions.

The optical interface 140 includes a connector for connecting to fiber connector 106 and optical elements, such as lenses 144, for directing light emitted from the ends of optical fibers of the fiber bundle 104 through the spacer 130 to the PIC 110 and/or light emitted from the PIC 110 through the spacer 130 to the end of an optical fiber. The fiber connector 106 can be detachable from the optical interface 140 or can be permanently attached. In some examples, the fiber connector 106 is integrated with the optical interface 140.

The PIC 110 includes a modulator 112, such as an electro-absorptive modulator (EAM), micro-ring resonator, or any suitable optical modulator having sufficient thermal stability, and a photodetector 114, such as a photodiode. Generally, a PIC includes more than two active components, and can include other types of active components too. The PIC 110 also includes grating couplers 116 and 118, which are located at the top surface of the PIC 110. The grating couplers 116, 118 can be surface relief gratings with grating lines arranged to direct light that is normally incident (or near normally incident) into guided modes in planar gratings that are in the lateral plane of the PIC 110. The grating coupler 116 is optically connected to modulator 112 by a waveguide 124 and grating coupler 118 is optically connected to photodetector 114 by a waveguide 126.

The EIC 150 is mounted in the package overlapping a portion of the top surface of the PIC 110. The EIC 150 includes a driver 152 and a transimpedance amplifier 154 which are electrically connected to the modulator 112 and photodetector 114 via electrical interconnects 156 and 158, respectively. The electrical interconnects 156 and 158 each include a copper pillar (162 and 164), which provide electrical connections between the bottom surface of the EIC 150 and the top surface of the PIC 110. Generally, the copper pillars are relatively short, e.g., 100 μm or less, 50 μm or less, so that the bottom surface of the EIC 150 and the top surface of the PIC 110 are close to each other in the overlapping portion. The space between the copper pillars is filled with the molding compound 134.

The spacer 130 is composed of a material that is transparent to light having the wavelengths at which the optical components of system 100 operate. In other words, the amount of absorption and/or scattering of light at these wavelengths by the spacer material is sufficiently low to permit scatter-free passage of light at these wavelengths through the spacer to allow optical signals to be reliably transmitted back and forth between the PIC and the optical interface during operation of the system 100. The spacer material should also be compatible with the manufacturing processes used to make circuit package 101 and have mechanical and chemical properties compatible with the other components of the package and the expected operational lifetime of the package.

Generally, the spacer material can be an organic or inorganic material and it can be crystalline, polycrystalline, or amorphous in nature. Examples of suitable spacer materials can include Ge, Si, ZnS, ZnSe, AlO, MgF, GaAs, $CaF_2$, and $BaF_2$. Inorganic glasses, such as BK7 and fused silica, can be used.

The spacer 130 can be composed of a single homogeneous piece of material or can be a non-homogeneous. For example, in some examples, the spacer 130 is formed from a graded-index (GRIN) material. GRIN materials can be used, e.g., to provide optical power to focus light between the optical elements in the interface 140 and the grating couplers or to reduce refractive index mismatch at the interface between the spacer and PIC and/or spacer and interface.

In some examples, the spacer 130 can be a composite spacer, composed of multiple pieces of different material. In certain examples, the spacer 130 can include thin films at one or more interfaces, such as an antireflection film at the top and/or bottom interface. In certain examples, the spacer 130 can have include embedded optical elements, such as a lens (or lenses).

The spacer 130 is attached to the surface of the PIC in a manner sufficient to withstand the manufacturing steps subsequently performed to the package, and withstand stresses associated with the operational environment in which the package is deployed. For example, the attachment should be sufficiently robust to withstand the injection molding and/or other processing involved in encapsulating components using the molding compound. The spacer can be attached to the top surface of the PIC 110 by an optical adhesive, e.g., a UV-curable optical adhesive. The attachment should be sufficient to prevent any molding compound getting between the spacer 130 and the optical couplers 116 and 118.

The spacer 130 is sized and shaped in the lateral directions to cover the grating couplers, to fit within the portion of the top surface of the PIC 110 not overlapped by the EIC 150, and in the vertical direction to provide a surface than is coplanar with the top surface of the EIC 150 so that the optical interface 140 can be readily mounted onto the surface 135. Generally, in the present example, the vertical thickness, T, of the spacer 130 is approximately the same as or slightly greater than the vertical thickness of the EIC 150. T can be in a range from 100 μm to 5 mm, depending on the implementation. Furthermore, while the top surface of the spacer 130 is coplanar with the top surface of the EIC 150 in the present example, more generally, a slight mismatch in the surface heights is permissible provided the surface is appropriate for attachment of the interface 140. In some examples, the surface heights can be mismatched by an amount in a range from 10 nm to 10 μm, e.g., from 100 nm to 1 μm.

In the lateral directions, the spacer can have a minimum dimension in a range from 50 μm to 5 mm and a maximum dimension in a range from 500 μm to 20 mm. The shape of the spacer 130 can also vary. In some cases, the shape of the spacer in the lateral plane is rectangular, square, circular, or elliptical.

The edge of the spacer 130 can be positioned close to or touching the edge of the EIC 150. As illustrated, these edges are separated in the x-direction by a distance, D, which can be in a range from zero to 20 mm. Where the edges of the EIC 150 and the spacer 130 are touching, there may be little or no molding compound 134 between the edges.

The opposite edge of the spacer 130 can be a relatively large distance, d, from the corresponding edge of the PIC 110. In some cases, d can be in a range from 1 mm to 20 mm, e.g., 2 mm or more, 5 mm or more, such as 10 mm or less. In some cases, d can be zero, e.g., the edge of the spacer 130 aligns with the edge of the PIC.

The base 132 can include, for example, one or more interposers, redistribution layers, printed circuit boards, and/or other components used in a circuit package.

In general, the operative wavelength band of the system 100 can be one of a variety of commonly used bands for optical communications. Generally, the operative wavelength(s) are in the near infrared (NIR) part of the spectrum (e.g., 1300 nm to 1650 nm) and can be, for example, C-band wavelengths (1530 nm to 1565 nm).

Together, the waveguide 124, grating coupler 116, spacer 130 and lens 144 compose an optical path through the package 101 between the modulator 112 and an end of a first optical fiber in the bundle 104. During operation, the driver 154 drives modulator 114 to modulate an optical signal in the PIC which is carried over the optical path from the PIC 110 to the other component 102 via the first optical fiber. The waveguide 126, grating coupler 118, spacer 130, and lens 142 compose a second optical path through the package 101 from a second optical fiber to the photodetector 114. This optical path is used to received optical signals from the other component 102 at the photodetector 114, which then converts them to electrical signals which are detected and processed in the EIC 150 via the TIA 152. Collectively, the two optical paths provide a bidirectional photonic link between the circuit package 101 and the other component 102.

The optical interface 140, the spacer 130, and optical couplers 116 and 118 constitute an interface block which facilitates transfer of light to and from the fiber bundle 104 and the waveguides in the PIC 110. In general, the size, length, material, and number of optical elements (e.g., lenses) that may be included an interface block depends on specific requirements of the implementation, such as the wavelength of light, the coupling efficiency, and the cost. Generally, interface blocks can include a variety of mechanisms of providing an optical interface between the fiber(s) and/or the fibers and PIC, for example, an edge coupler; a grating coupler (GC), a graded index (GRIN) lens coupler, a fiber Bragg grating (FBG) coupler, a micro-lens array (MLA) coupler, an evanescent wave (EW) coupler, an adiabatic coupler, a wavelength division multiplexing (WDM) coupler, a prism coupler, a butt coupler, an end-fire coupler, and a V-groove coupler. In certain examples, the interface block includes a polarizing beam splitter to separate light into orthogonal polarization states. Such beam splitters can be used to combine two orthogonally polarized signals exiting the PIC and/or to split an unpolarized signal into two orthogonal polarization states before the signal enters the PIC. In some examples, the interface block includes a fiber array unit (FAU) for connecting the PIC with an array of optical fibers. For example, the fiber connector 106 and optical interface 140 can constitute a FAU that is bonded to the surface 135 of the package 101. The FAU may be one of a variety of types of FAUs including linear and circulate. FAUs are typically made from precision-molded plastic or ceramic material and may have anywhere from a few to hundreds of fibers arranged in a specific pattern, e.g., 30 fibers or more, 40 fibers or more, 80 fibers or more, such as 200 fibers or less. The choice of FAU (or FAU type) may depend on specific requirements of an application, such as the number of fibers, the arrangement of the fibers, the wavelength of light being used, and the coupling efficiency desired.

As noted above, the molding compound 134 at least partially encapsulates the PIC 110, the EIC 150, and the spacer 130 within the package 101 against the base 132. In other words, the molding compound 134 at least partially encloses the PIC 110, EIC 150, and the spacer 130 by filling in the space between these components and the base 132. While the partially encapsulated EIC 150 in package 101 has an exposed top surface that is coplanar with the top surface of the spacer 130, other implementations are possible. For example, referring to FIG. 2, another example circuit package 101 includes a layer of molding compound 234 that extends over the top surface of the EIC 150. The surface 235 of the molding compound layer is flush with the top surface of a spacer 230, which is has a thickness, T, that extends higher (in the z-direction) than the EIC 150. The surface 235 and the top surface of the spacer 230 form a continuous, planar surface on which the optical interface 140 is mounted.

In general, the co-packaged optics described herein (both for FIG. 1, FIG. 2, and below) can be used in an artificial intelligence (AI) accelerator, a bridge, a chiplet, or any other configuration that can benefit from photonic links on and off the package or within the package. Examples can include packages with more than one EIC that share a common PIC interposer and communicate via a plurality of intra-chip bidirectional photonic channels. Other examples include circuit packages that include an EIC which can communicate with external components via a plurality of inter-chip bidirectional photonic channels as discussed in further detail herein.

Figure 2:
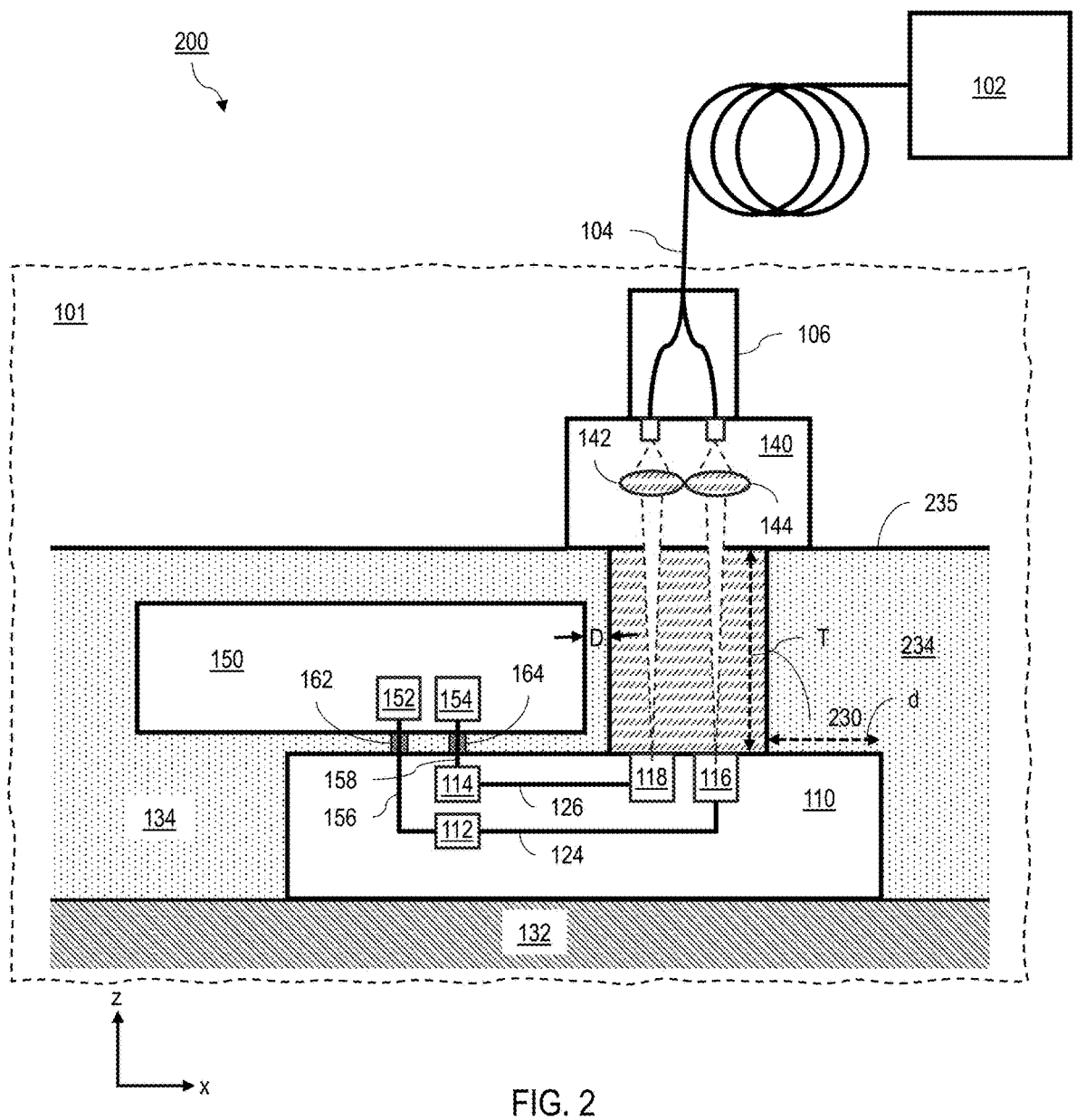
FIG. 2 is a schematic cross-sectional view of another example system that includes a circuit package with co-packaged optics.
Figure 3A:
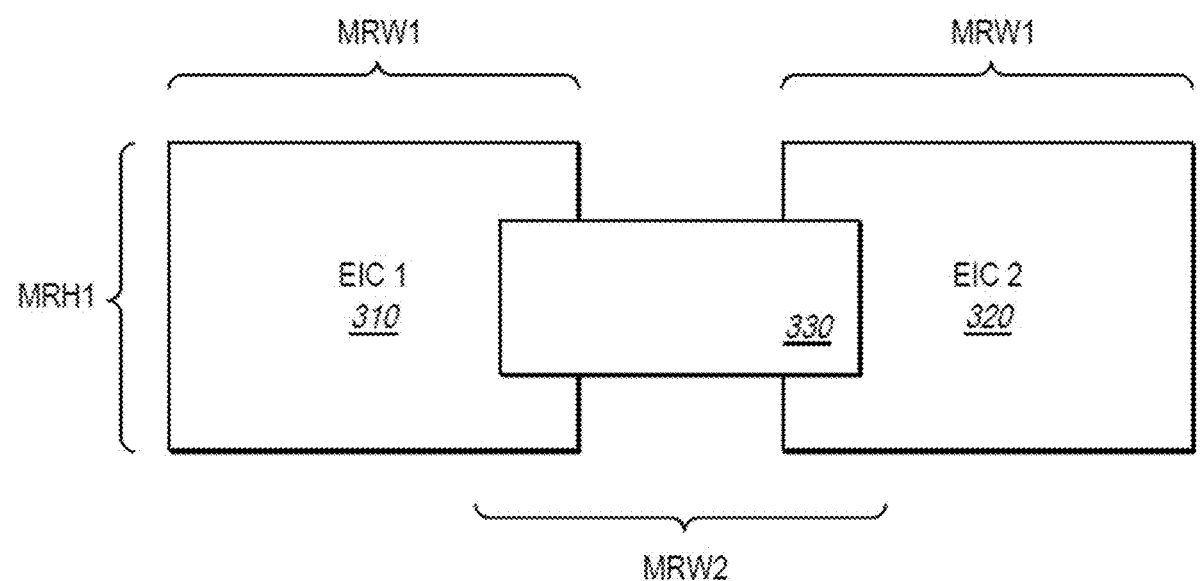
FIG. 3A is a schematic plan view of an example of a circuit package with co-packaged optics.
Figure 3B:
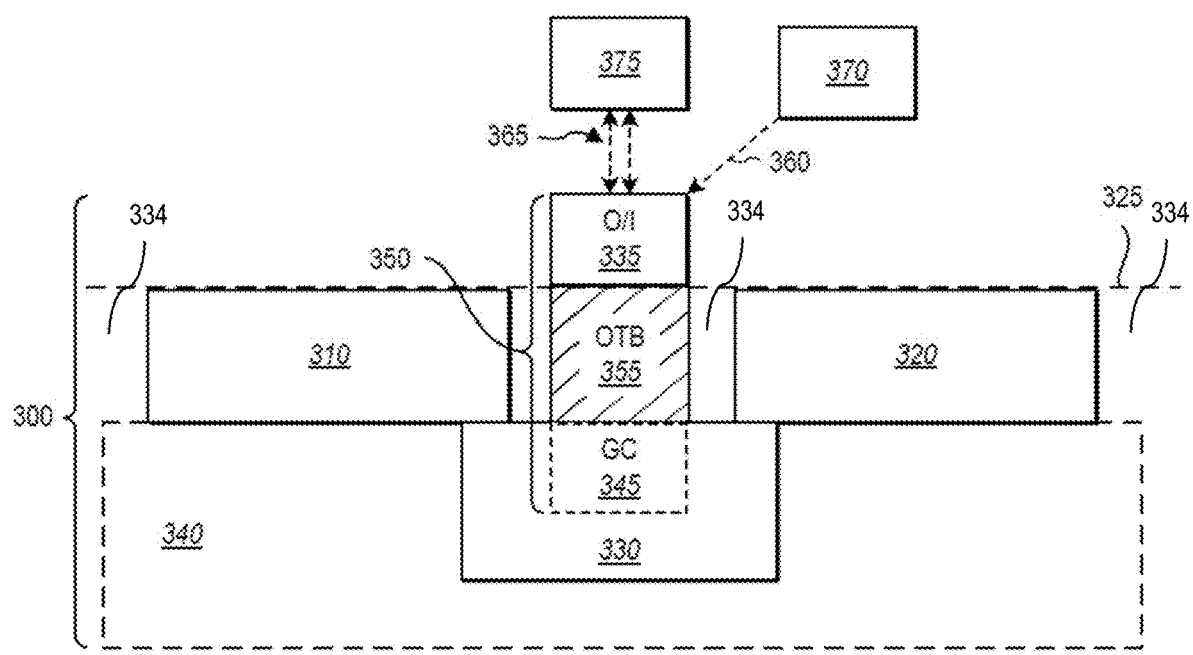
FIG. 3B is a schematic cross-sectional view of the example circuit package shown in FIG. 3A.

While the foregoing example features a circuit package that includes a PIC and a single EIC, other implementations are possible. For example, FIG. 2 and FIG. 3 show components of an example package 300 including a first EIC 310, a second EIC 320, a PIC 330 with a grating coupler region 345 (GC), an optical interface 335 (O/I), and a transparent spacer 355 (also referred to as an optically transparent block, or OTB). FIG. 2 shows a plan view while FIG. 3 shows a side view. EIC 310 and EIC 320 (which collectively form an electrical layer) are attached to the PIC 330 on opposing sides of the PIC, overlapping with opposing edges of the PIC. The EICs 310 and 320, spacer 355, and PIC 330 are at least partially encapsulated by a layer of a molding compound 334.

The optical interface 335 is located at a top portion of the package 300 and connected to the top surface of the spacer 355. In particular, the optical interface 335 is above the electrical layer of the package 300. In general, the term "top" is not meant to be limiting, since the configuration can be rotated or flipped to where the OI appears at the bottom or the side of the package in various implementations, but merely refers to the relative orientation of the components as shown in the drawings.

The bottom surface of the optical interface 335 is coplanar with the top surface of the electrical layer of the package 300. The plane is indicated in FIG. 3 by a dashed line 325, which coincides with the top of the spacer 355, the top surface of the first EIC 310, the top surface of the second EIC 320, and the surface of the layer of molding compound 334, which are at the same (or nearly the same) level. The dashed line 325 represents a plane that extends into the plane of the drawing corresponding to the top surfaces of the EICs 310 and 320.

The spacer 355 fits in the space on the top surface of the PIC 330 between EIC 310 and 320. Accordingly, the lateral dimension of the spacer along this direction is smaller than the separation between the edges of the EIC. Generally, this separation can be 20 mm or less, e.g., 8 mm or less, 15 mm or less, 12 mm or less, 10 mm or less, 8 mm or less, 5 mm or less 3 mm or less, 2 mm or less, 1 mm or less, such as 50 µm or more, 100 µm or more, 200 µm or more. The separation between the edges of the EIC's can be smaller than the corresponding dimension of optical interface 335. In some examples, the optical interface 355 overlaps the top surface of one or both of the EICs 310 and 320.

An optical substrate 340 can be coupled to the PIC 330 such that the PIC 330 is embedded in the optical substrate 340. Although shown as flush in FIG. 3, more generally, PIC's may not be flush with the top surface of the optical substrate 340, e.g., the PIC can at least partially protrude from and above the optical substrate 340, or can be embedded below the top surface of the optical substrate 340. Further, while the surfaces of the EICs and PIC are depicted as flat, more generally, the surfaces can include structures, e.g., portions of electrical interconnects, which protrude from or are recessed in the surfaces. The specific number of elements, the number of interconnects, dies, and other devices, can vary. In some examples, the package includes an adhesive, a sealant, an underfill, a mold, an overmold, or other structural or dielectric material. In some implementations, certain elements may be positioned at a different location within a signal path relative to other elements.

The package 300 includes unidirectional photonic links in both directions that create inter and intra chip bidirectional communication with external components and between the dies (e.g., the first EIC 310 and the second EIC 320). For example, light enters (and exits) the package 300 at the optical interface 335, passes through the spacer 355, and into (or out of) the PIC 330 via the grating coupler region 345. Additionally, one or both of the EICs may utilize unidirectional photonic links that are part of an inter-chip channel in order to communicate with another device through the interface block 350 and the OTB 355 of the circuit package 300.

The optical interface 335, the spacer 355, and a portion of the PIC 330 that includes the grating coupler 345 collectively form an interface block 350. Light pass from a light engine 370 via fiber(s) 360 and/or an external device 375 via fibers 365 to the package 300. For example, light signals pass from an external device 375 to the PIC 330 via the interface block 350 (e.g., through the optical interface 335, the spacer 355, and the grating coupler 345).

A variety of different light engines can be used for the light engine 370. In some examples, as shown in FIG. 3, the light engine 370 is external to the package 300. Alternatively, the light engine can be integrated into the PIC 330. Example implementations can use the following light engines to bring an optical signal to and from a package that includes PIC 330: lasers, such as diode lasers, e.g., vertical-cavity surface-emitting lasers (VCSELs); light-emitting diodes (LEDs); and super luminescent diodes (SLDs). The choice of light engine may depend on specific requirements of the implementation, such as wavelength, power, and modulation speed.

In various implementations, one or more external devices connect to the package. For example, an external device 375 connects to the package 300 via the fibers 365. For instance, optical input and/or output can occur to and from external processes or devices (e.g., the external device 375) that are communicatively coupled to the package 300 via the fibers 365. In one or more implementations, the external device 375 includes components to process communications sent from the package 300 via the fibers 365. For example, the external device 375 includes a photo detector (PD) that receives light signals and/or a modulator (MOD) (e.g., an EAM) to send light signals.

Figure 4:
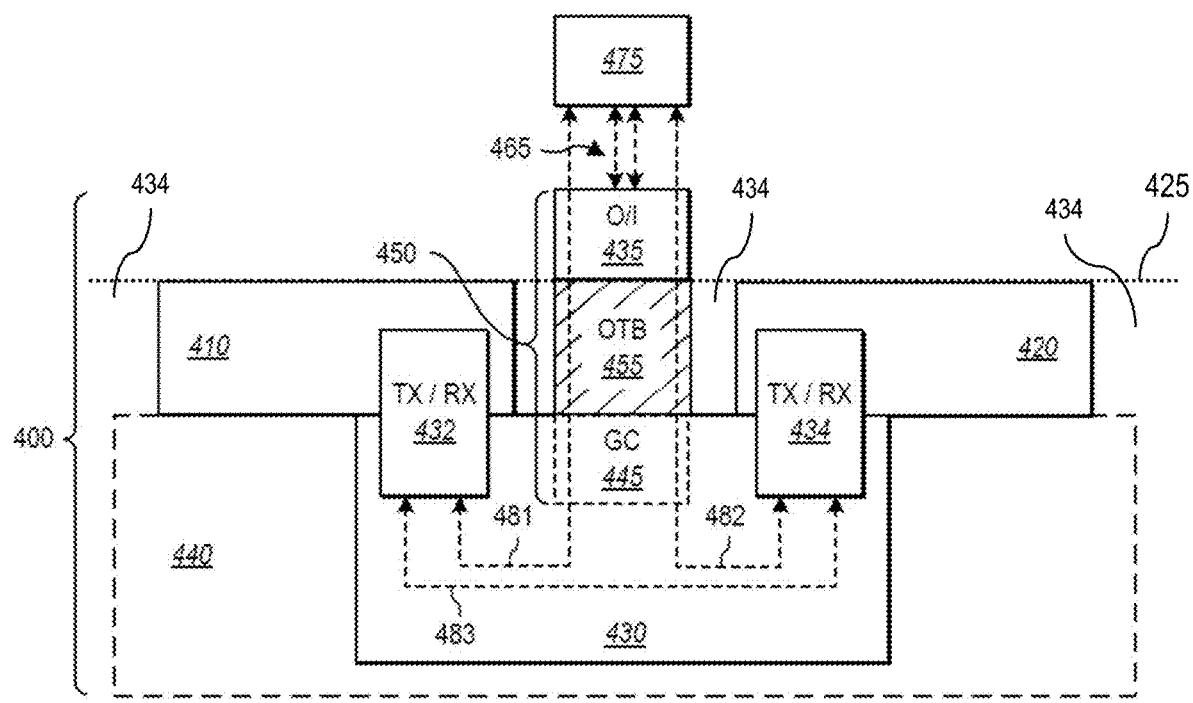
FIG. 4 is a schematic cross-sectional view of another example circuit package with co-packaged optics.

FIG. 4 shows components of an example package 400 that includes an interface block 450, PIC 430, a first die region 410 (e.g., an EIC), a second die region 420 (e.g., an EIC), and an optional substrate 440. The die regions 410 and 420, the spacer 455, and the PIC 430 are at least partially encapsulated by a layer of a molding compound 434. The top surface of the EICs, the spacer 455 and the layer of the molding compound 434 are coplanar. The package 400 includes similar features and components as the package 300 shown in FIG. 3A and FIG. 3B.

To illustrate, the interface block 450 includes an optical interface 435 (O/I), a spacer 455 (OTB), and a grating coupler region 445 (GC) (e.g., each link that is routed through the OTB 455 has a GC that is located in the GC region 455), which align with the corresponding components described above. While the OI 435 and GC 445 are shown as single units, in one or more implementations, the OI 435 and GC 445 may represent 2-dimensional regions where any number of grating couplers can be present as components of different links on and off the package. Likewise, OI 435 can have any number of optical interfaces positioned within a region where light enters and exits the OTB 455. As mentioned above, the interface block 450 may include any mechanism or means for interfacing between a fiber (e.g., fibers 465) and a photonic IC (e.g., PIC 430), similar to the example discussed above in connection with FIG. 3A and FIG. 3B.

An external device 475 is connected to the package 400 via fibers 465. In some implementations, the external device 475 is another instance of the package 400. Alternatively, the external device 475 can be any computing device capable of being optically connected to the package 400, such as general-purpose computer or AI accelerator coupled to an optical chiplet with fiber connections or an optical memory appliance with photonic channel interfaces and compatible optical hardware. In addition, FIG. 4 illustrates a first photonic transceiver 432 and a second photonic transceiver 434. A portion of the first photonic transceiver 432 is in the EIC layer of the silicon-photonic package. It has been shown as being in a first die region 410 for convenience. In some examples, the portion of the first photonic transceiver 432 is separate from any die that is connected to the first die region 410 and can have wirebonds, RDL connections, or other suitable connection to the die. Alternatively, the package can be fabricated or provided without any dies and only having the portion of the first photonic transceiver 432 in the first die region 410. Similarly, a portion of the second photonic transceiver 434 is in the second die 420. Another portion of the first photonic transceiver 432 is in the PIC 430 while another portion of the second photonic transceiver 434 is in the PIC 430.

FIG. 4 also shows bidirectional photonic paths 481, 482, and 483. In this example, the bidirectional photonic path 483 connects the first photonic transceiver 432 and the second photonic transceiver 434. Bidirectional photonic path 483 can include two or more unidirectional photonic paths in opposite directions (one unidirectional link goes from the transmitter associated with die region 410 to the receiver associated with die region 420. The other unidirectional link goes from the transmitter of die 420 to the receiver of die 410, to create a bidirectional path between the two transceivers to enable optical communication and/or data movement across the photonic path in both directions between a first die and a second die 420 which could be connected electrically in the first and second die regions 410 and 420. (e.g., via an intra-chip bidirectional photonic channel).

Bidirectional photonic path 481 links the first photonic transceiver 432 to the external device 475 through the interface block 450 and fibers 465. Similarly, bidirectional photonic path 482 links the second photonic transceiver 434 to the external device 475 via the interface block 450 and the fibers 465.

In examples, the external device 475 includes one or more photonic transceivers for sending and receiving data to the package 400. For instance, transmitters on the external device 475 can send data via unidirectional photonic links which connects to receivers in blocks 432 and 434 for example.

FIGS. 5A-5D illustrate other example circuit packages that use interface blocks to create a portion of a photonic path between a circuit package and one or more external devices. Similar to the above description, the packages include an interface block 550 with an optical interface 535 (O/I), a spacer 555 (OTB), and a grating coupler region 545 (GC) within a PIC 530. The package 500 further includes a first die 510, a second die 520, and an optical substrate 540. The spacer 555, PIC 530, and the first and second dies 510 and 520 are at least partially encapsulated in a layer of a molding compound 534 and the top surface of the first and second dies and the spacer 555 are coplanar with the surface of the molding compound layer.

Figure 5A:
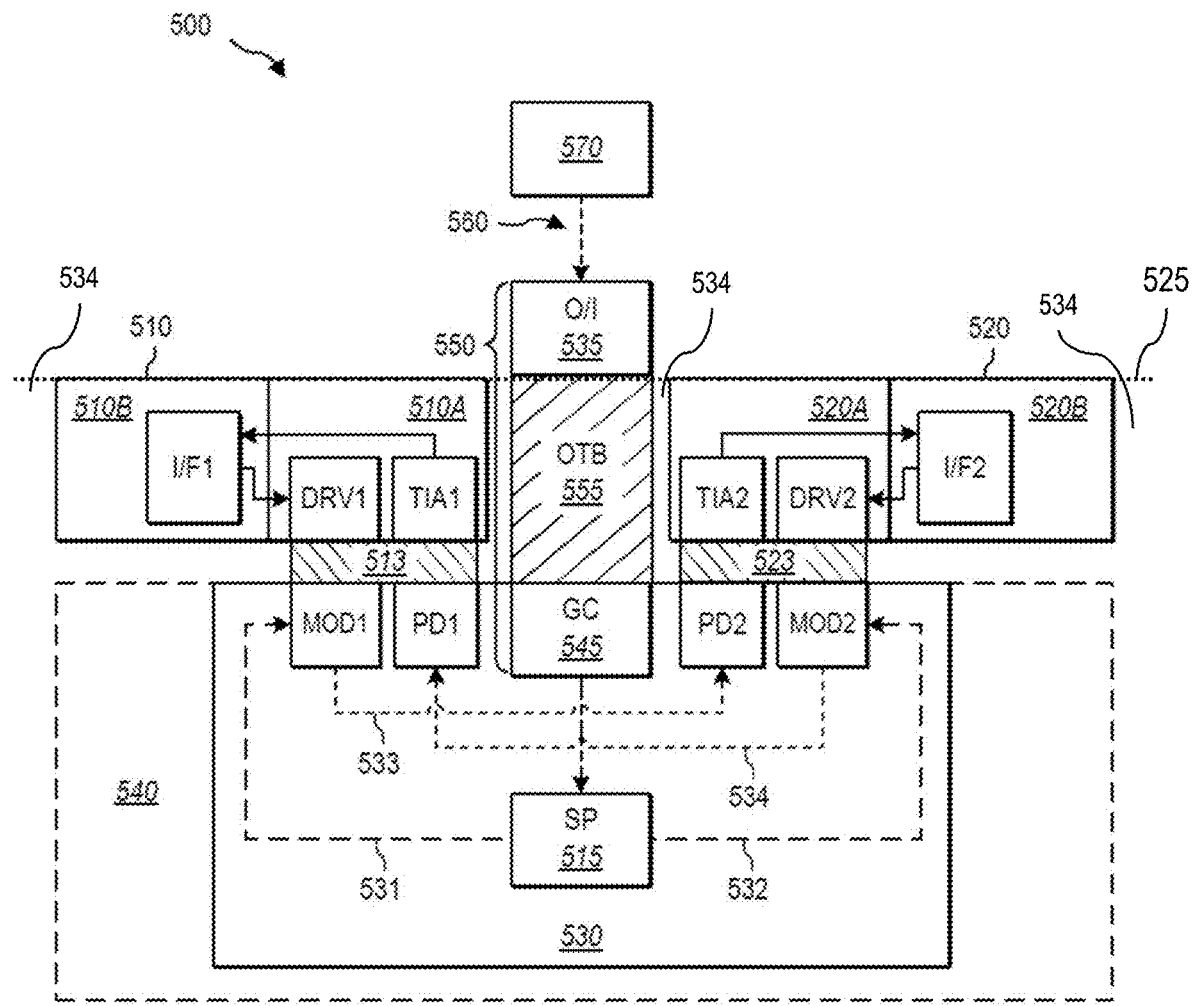
FIG. 5A is a schematic cross-sectional view of another example circuit package with co-packaged optics.

FIG. 5A shows an example package 500 including intra-die connections, illustrating optical paths starting at a light engine 570 that pass through the optical interface 535 and the spacer 555 to provide light to the PIC 530. The first die 510 is divided in a general part 510B that may include various processing, storage, and communication functions and/or components which would typically be associated with a CPU, GPU, and the like, and an AMS part 510A that includes analog/mixed-signal circuits for interfacing with the PIC 530. In various examples, 1) the AMS part and the die (if present) can be fabricated together as a single die, or 2) AMS part can represent a chiplet with conventional electrical connections to the die (which may or may not be present), or 3) the AMS part can represent a chiplet that provides electrical interconnection to an area in the die 510 where a die can be placed in a later manufacturing stage. The AMS part 510A of the first die 510 may include a driver (DRV1) and a transimpedance amplifier (TIA1). The AMS part 520A of the second die 520 may include a driver (DRV2) and a transimpedance amplifier (TIA2). The general part 520B of the second die 520 may include various processing, storage, and communication functions and/or components like processors and memory.

The light engine 570 transmits light via fiber(s) 560 and the interface block 550 (e.g., the optical interface 535 (O/I), the spacer 555, and the grating coupler region 545 GC) into splitter 515 (SP) inside the PIC 530. The splitter 515 distributes the light over two different photonic paths 531 and 532 towards modulator MOD1 and modulator MOD2. In one or more implementations, the splitter 515, or a splitter tree, distributes the light over more than two different photonic paths to additional modulators. A photonic path may be implemented with any suitable optical transmission medium and may include a mixture of waveguides and fibers.

Modulator MOD1 modulates the light it receives from the splitter 515 with information from driver DRV1 and transmits the modulated light to photodetector PD2 via photonic path 533. Photodetector PD2 converts the received modulated light to an electrical signal for the second die 520. Jointly with a serializer (not shown) in the first die 510, the driver DRV1, transimpedance amplifier TIA2, and a deserializer (not shown) in the second die 520, modulator MOD1, photonic path 533, and photodetector PD2 form a data channel from the first die 510 to the second die 520.

Similarly, modulator MOD2 modulates the light it receives from the splitter 515 with information from driver DRV2 and transmits the modulated light to photodetector PD1 via photonic path 534. Photodetector PD1 converts the received light to an electrical signal for the first die 510. Jointly with a serializer (not shown) in the second die 520, the driver DRV2, transimpedance amplifier TIA1, and a deserializer (not shown) in the first die 510, modulator MOD2, photonic path 534, and photodetector PD1 form a data channel from the second die 520 to the first die 510.

The PIC 530 includes a first interconnect region 513 and a second interconnect region 523. The first interconnect region includes a bondpad pattern located over MOD1 and PD1 that matches a bondpad pattern on the first die 510 located under DRV1 and TIA1 or is otherwise configured to form an electrical interconnection between the respective components. The second interconnect region includes a bondpad pattern located over PD2 and MOD2 that matches a bondpad pattern on the second die 520 located under TIA2 and DRV2 or is otherwise configured to form an electrical interconnection between the respective components.

Two or more bondpads of the bondpad pattern on the first die 510 are physically and electrically coupled with two or more bondpads of the bondpad pattern in the first interconnect region 513, and two or more bondpads on the bondpad pattern on the second die 520 are physically and electrically coupled with two or more bondpads of the bondpad pattern in the second interconnect region 523. The distance between the lower surface of the first or second die regions 510 or 520 and the top surface of the PIC 530 is typically in the range of 100-400 microns. In one or more examples, the interconnects (e.g., in the first interconnect region 513 and/or second interconnect region 523) connecting the dies (e.g., the first die 510 and/or the second die 520) to the top surface of the PIC 530 are 100-400 microns. In addition, the interconnects may be implemented using a variety of structures including, by way of example, copper pillars, solder connections, pads (e.g., bondpads), bump attachments, vias, or any variety of means by which the dies may be coupled to the PIC.

An electrical interconnect is shown as making a coupling (or abutted coupling) between elements in the AMS parts of the dies and the corresponding elements in the PIC 530. In general, an electrical interconnect can include a copper pillar having a length of 2 millimeters or less, e.g., between 100 μm and 400 μm. In certain implementations, the electrical interconnects can include solder bumps formed of a material such as tin, silver, or copper. If solder bumps are used for the interconnects, then the solder bumps may be flip-chip bumps. The interconnects can be elements of a ball-grid array (BGA), pins of a pin grid array (PGA), elements of a land grid array (LGA), or another type of interconnect. In each of these examples, the interconnects can be 2 millimeters or less in length and, in some examples, between 100 μm and 400 μm.

In general, the interconnects have drivers (DRVs) or transimpedance amplifiers (TIAs) at one end and optical modulators (MODs) or photo detectors (PDs) at the other end. For example, the interconnects can physically couple with, and allow electrical signals to pass between, pads of the dies and pads of the optical substrate 540 and/or the PIC 530. For instance, an interconnect between a driver and a modulator allows the driver to provide an electrical signal that drives the modulator. In another instance, an interconnect between a transimpedance amplifier (TIA) and a photo detector allows the transimpedance amplifier to amplify an optical signal from the photo detector.

The interconnects, e.g., in the first interconnect region 513 and/or second interconnect region 523, may not have a uniform size, shape, or pitch. A finer pitch of interconnects may be desirable to allow a denser communication pathway between elements coupled to the PIC 530. In certain implementations, one or more interconnects have minimal lateral displacement. For example, an interconnect is a copper pillar that is straight up and down, perpendicular to the face of a die and the PIC 530 (e.g., between 100-400 microns in length. This allows the transceiver portions in the AMS block (e.g., DRV and TIA) to be directly stacked at one end of the interconnect above its respective transceiver portion in the PIC (EAM and PD) at the other end of the interconnect. In some examples, the DRV and TIA and EAM and PD can be slightly offset from the copper pillar to reduce parasitics and still enable a sub 400-micron gap (interconnect length) between heat producing elements in the EIC/AMS and passive elements in the PIC.

Figure 5B:
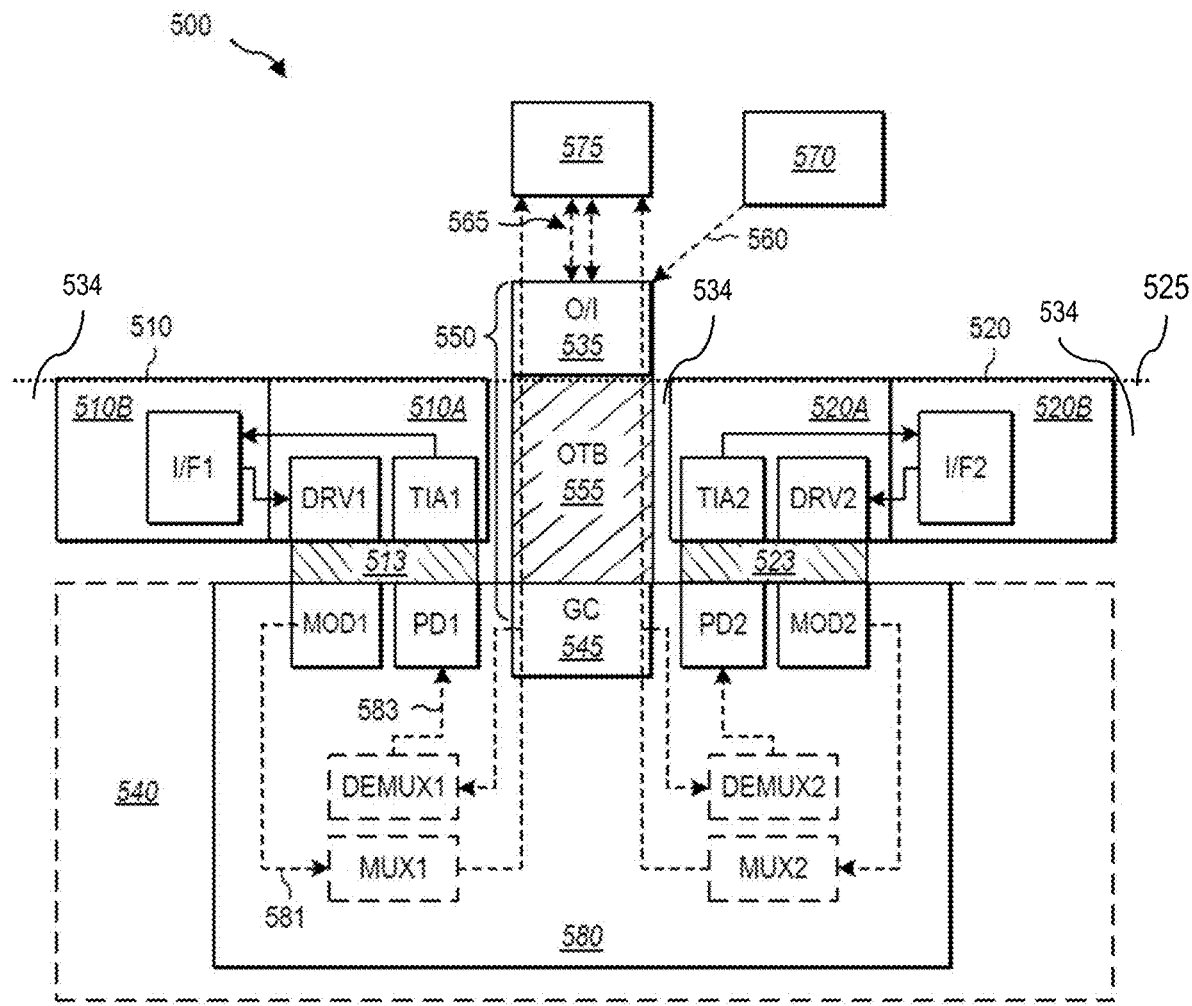
FIG. 5B is a schematic cross-sectional view of another example circuit package with co-packaged optics.

Moving on, FIG. 5B shows an example of an inter-chip or inter-package connection(s). In particular, a circuit package 500 uses interface block 550 to create a portion of a photonic path between the circuit package and one or more external devices. Similar to the above description, the interface block 550 in the package 500 includes the optical interface 535, the spacer 555, and the grating coupler region 545 (with a PIC 580). The interface block 550 includes a spacer that allows light signals from the PIC 580 to enter and exit the package 500 via the optical interface 535. The spacer 555 also includes portions one or more bidirectional photonic paths to allow dies connected to the PIC 530 to communicate with other external devices.

In FIG. 5B, paths for unmodulated light have been omitted in the PIC 530. Instead, a first EIC 510 and second EIC 520 can photonically communicate with an external device 575 (e.g., an external device optical interface) via fibers 565, the PIC 580, and the interface block 550, which form portions of a bidirectional photonic channels between the dies and the external device 575. The first EIC 510 may transmit to the external device 575 via I/F1, DRV1, MOD1, and a photonic path 581 (which includes an optional multiplexer MUX1 (e.g., in case wavelength division multiplexing is desired), the first grating coupler in GC region 545 (GC), the spacer 555, the optical interface 535 (I/O), and/or the fibers 565). Similarly, the first die 510 may receive data from the external device 575 via photonic path 583, (which includes the fibers 565, the optical interface 535, the spacer 555, a second grating coupler in GC region 545, and/or an optional demultiplexer DEMUX1 (e.g., in case wavelength division multiplexing is desired)), PD1, TIA1, and I/F1. The photonic path 581 and the photonic path 583 form a bidirectional data path between two devices on different chips, wherein the light in each direction of the data path is routed through the spacer 555.

Figure 5C:
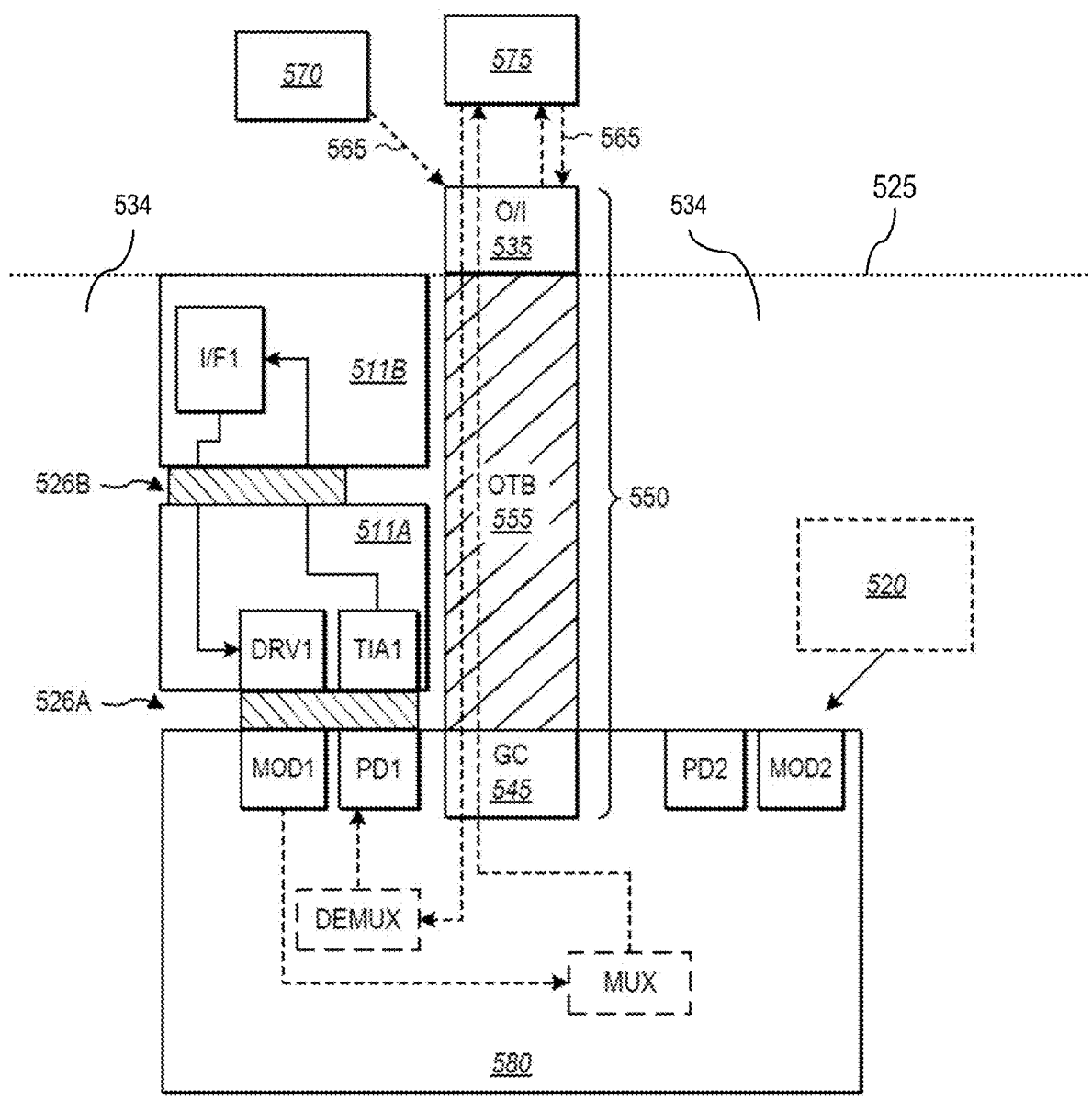
FIG. 5C is a schematic cross-sectional view of another example circuit package with co-packaged optics.

Additional configurations may make use of the interface block 550 including the spacer 555, the optical interface 535, and the grating coupler region 545 in accordance with one or more examples. For example, FIG. 5C illustrates an example implementation showing a stacked-EIC arrangement. Here, two EICs are stacked vertically rather than horizontally. A first AMS EIC 511A and a first general EIC 511B. The first AMS EIC 511A includes the AMS circuits (DRV1 and TIA1). The first general EIC 511B includes general/digital circuits, such as I/F1.

The first AMS EIC 511A is stacked on top of the PIC 580 and electrically connected to the PIC via electrical interconnects 526A. The first general EIC 511B is stacked on top of the first AMS EIC 511A and electrically connected to the EIC 511A via electrical interconnects 526B. The PIC 580 interfaces with light engine 570 and/or the external device 575 via the interface block 550 on the package 500 and the fibers (e.g., the fiber(s) 560 or the fibers 565). It will be appreciated that other implementations may include multiple stacked dies on either side of the interface block 550 (e.g., the second die 520) and allow optical accessibility to the PIC 580 via the top surface of the package 500.

Figure 5D:
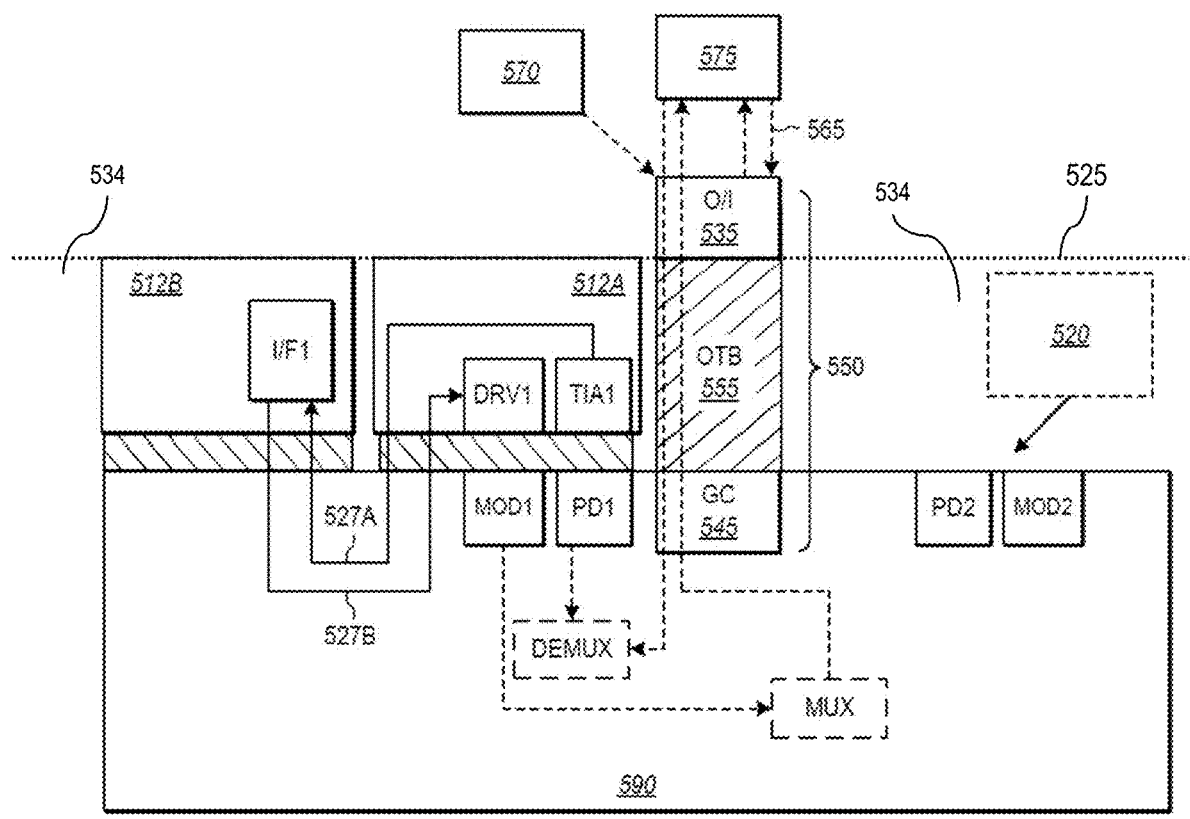
FIG. 5D is a schematic cross-sectional view of another example circuit package with co-packaged optics.

As another illustrative example, FIG. 5D shows an arrangement where the first general EIC 512B and the first AMS EIC 512A are separately stacked on a PIC 590 and positioned side by side (but not directly connected). An electrical inter-connection such as a bus may enable signals to and from the first general die 512B and the first AMS die 512A (e.g., using UCIe, PCIe, or other suitable protocol). The electrical interconnection may include a first electrical path 527A from TIA1 to I/F1 and a second electrical path 527B from I/F1 to DRV1. As shown, the first electrical path 527A and the second electrical path 527B may pass through the PIC 590. In some instances, the first electrical path 527A and the second electrical path 527B do not pass through the PIC 590 (e.g., they are otherwise directly or indirectly connected via one or more electrical paths).

While one or more of the above examples refer to specific types of EICs, interconnects, substrates, grating couplers, and other specific elements associated with transmitting signals via respective components of the example packages, these are illustrative examples and may use different types of components. For example, the two (or more) EICs may refer to a variety of hardware or EIC, and not necessarily the pairing of general EIC and AMS EIC as described in specific implementations herein. Indeed, the two EICs may be similar types of hardware and may refer to computing hardware, processing hardware, storage hardware, memory hardware, or other hardware that is implemented on dies and which may be coupled to a PIC that optically couples one or more of the dies to an external component in accordance with one or more examples described herein.

As mentioned above in connection with each of the examples shown in FIGS. 5A-5D, the inter-chip or inter-package connection(s) includes an interface block 550 having a spacer 555, which forms a portion of an optical pathway in both directions (e.g., a bidirectional photonic path), through which data may be communicated between a variety of external components such as external device 575.

Generally, the spacer 555 can include any of the features of other spacer examples described herein.

As shown in each of FIGS. 5A-5D, the spacer 555 may extend from a surface of the photonic die (e.g., a top surface of the PIC) to a top surface of the circuit package (e.g., even or level with where the first and second dies could be placed), essentially to the same plane as the top surface of the electronic integrated circuit (EIC), application-specific integrated circuit (ASIC), and/or another electrical layer that was flip-chip bonded to the PIC. Having the top of the spacer 555 coplanar with the top surface of the electrical layer creates a flat surface along the entire top of the electrical layer and makes it easier to precisely attach an optical interface 535 during the manufacturing process at the correct location above the spacer 555 since it occurs at the top of the package 500 and not on the overhang region of the PIC (as in the prior art), which is more difficult to access.

Additionally, in some implementations, the spacer 555 may have a gap between any of its sides and one or more of the dies that can be placed in the die region either during or after fabrication of the package. In various implementations, the spacer 555 may substantially or completely fill in the space between the dies, with little to no gap between the side edges and the dies, as discussed previously with respect to the examples shown in FIG. 1.

In addition, it will be noted that features and functionality of the circuit package may be implemented within a variety of implementations and configurations of packages having different components and configurations. Indeed, the circuit package may be implemented as part of any of a variety of optical blocks that form a portion of an inter-package photonic channel passing between a grating coupler region and an optical interface (or other interface block component), and which may be coplanar with a top surface of the package (e.g., the top surface of the electrical layer of the circuit package). In one or more examples, the circuit package is part of an optical bridge like the one described in application Ser. No. 18/123,083 entitled "Optical Multi-Die Interconnect Bridge (OMIB)", the entirety of which is incorporated by reference.

Figure 6:
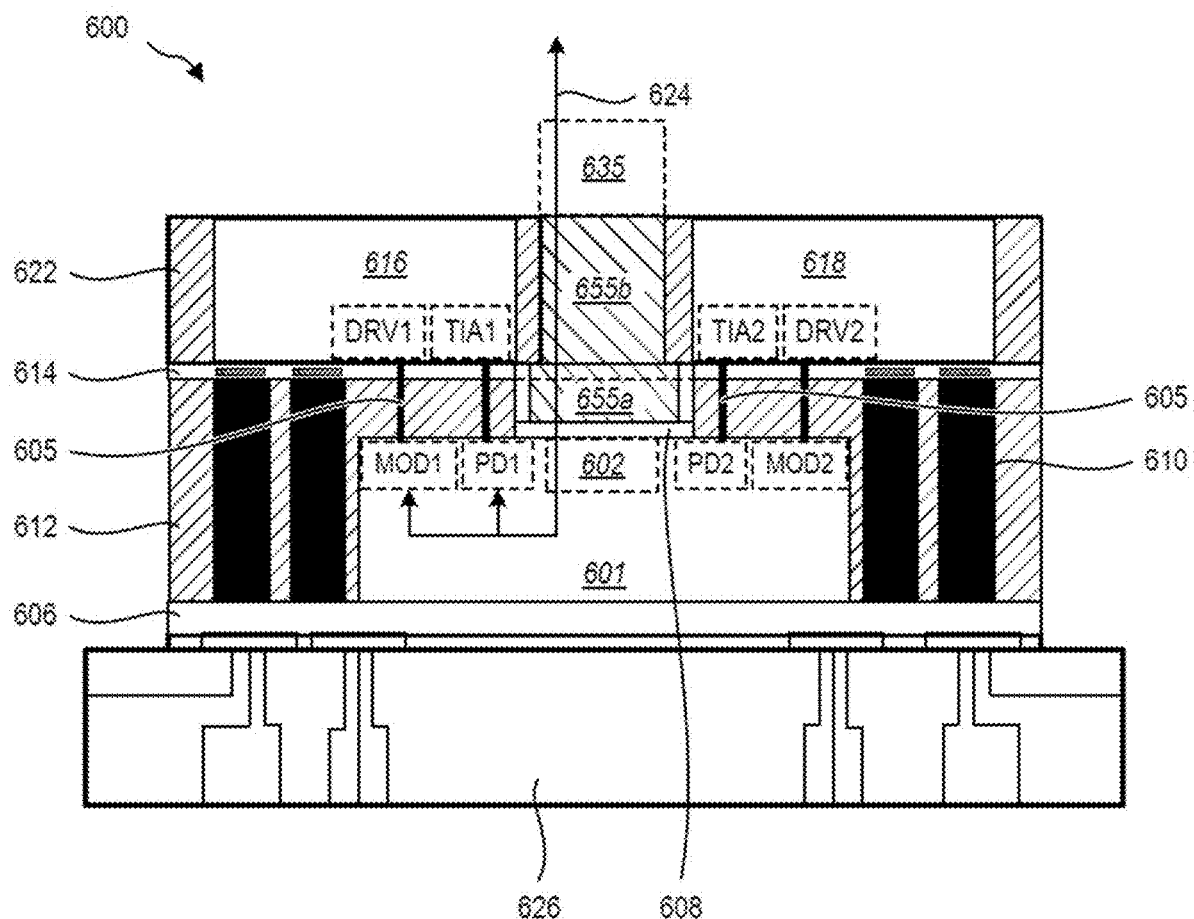
FIG. 6 is a schematic cross-sectional view of another example circuit package with co-packaged optics.

FIG. 6 illustrates a side view showing a cross-section of a further example of a circuit package 600 including one or more similar elements as the schematic diagrams of the packages discussed above in connection with FIGS. 1-5D. The circuit package 600 includes a PIC 601, a first hardware region 616 (e.g., for a first EIC) and a second hardware region 618 (e.g., for a second EIC). As shown, the PIC 601 includes a grating coupler 602 that allows light signals to enter and exit the PIC 601. In many examples, such as shown in FIG. 6, a portion of the first hardware 616 and a portion of the second hardware 618 are positioned over the grating coupler interface portion 602 of the PIC 601.

The PIC 601 is positioned over a first redistribution layer 606. The redistribution layer may provide any number of connection structures (e.g., interconnects) through which components of the circuit package 600 and a circuit assembly 626 may communicate. For example, while not shown in FIG. 6, the circuit assembly 626 may be coupled to any number of electrical or optoelectrical components which enable electrical communications to pass between the circuit package 600 and other components that are electrically coupled to the circuit assembly 626 via the first redistribution layer 606.

The first redistribution layer 606 (and other redistribution layers described herein, such as the second redistribution layer 614) may refer to a layer having a variety of thicknesses, and which includes one or more input/output (I/O) pads that provide availability of electrical elements of the circuit package to other areas of a chip or circuit package on which the circuit package is to be deposited. The redistribution layers (e.g., the first redistribution layer 606 and the second redistribution layer 614) may include wiring, interconnects, and other components that enable components of the circuit package 600 to be electrically coupled to components of one or more additional electronic packages.

As discussed above, adding some or all of an interface block allows the circuit package 600 to provide optically accessible co-packaged optics that connect one or more external packages to the PIC 601. Indeed, as discussed above, an interface block, and in particular, a spacer, provides a portion of a bidirectional photonic path within the circuit package 600 that allows a light engine or another external device to communicate with the hardware components that might be in the first hardware region 616 and the second hardware region 618).

In addition to the redistribution layers (e.g., the first redistribution layer 606 and the second redistribution layer 614) and the PIC 601, the circuit package 600 includes multiple conductive through vias 610. The conductive through vias 610 may be manufactured in any known way so electrical signals (such as power and control signals) can reach the first redistribution layer 606. Features and functionality of the conductive through vias 610 may be similar to the through-substrate vias (TSVs) discussed in U.S. patent application Ser. No. 18/076,196 entitled "THROUGH-SUBSTRATE VIA FORMED USING A PARTIAL PLUG THAT EXTENDS INTO A SUBSTRATE", the entirety of which is incorporated herein by reference.

The conductive through vias 610 provide interconnectivity between different layers of an electrical system within the circuit package 600. In addition, it will be understood that while FIG. 6 illustrates four conductive through vias 610, the circuit package 600 may include any number of conductive through vias 610 in various configurations. Further, while FIG. 6 illustrates a side view showing a single row of conductive through vias 610, additional vias may be manufactured toward additional axes (e.g., y-axis, z-axis) relative to the side view shown and discussed herein.

The circuit package 600 includes a first spacer 655a and a second spacer 655b (which may be combined to form a single, composite spacer, as shown in FIG. 3, FIG. 4, and FIGS. 5A-5D). For example, the spacers 655a-655b refer collectively to a spacer that provides a window, transparent at the operative wavelength(s), connecting a bottom surface the grating coupler interface portion 602 of the PIC 601 and a top surface to an optical interface (not shown), as described in various example examples above.

The first spacer 655a is placed over a top surface of the PIC 601. The spacers 655a and 655b can be composed of any suitable material, such as the examples described above. In some implementations, the first spacer 655a is a glass block that provides optical transparency through which a portion of an optical path 624 (e.g., a unidirectional or bidirectional optical path) may pass. In other, the first spacer 655a is a silicon layer.

The first spacer 655a is positioned over a portion of the top surface of the PIC 601. In various implementations, the first spacer 655a covers the grating coupler 602. In examples, the first spacer 655a extends vertically to a similar height as the conductive through vias 610. In some cases, the first spacer 655a extends further upward even beyond a top surface of the conductive through vias 610 (not shown).

The first spacer 655a is attached to a top surface of the PIC 601 via an adhesive or other bonding material. In one or more examples, the first spacer 655a is affixed to a top surface of the grating coupler interface portion 602 of the PIC 601 via a layer 608 of an optically transparent adhesive.

The optically transparent adhesive 608 may be made from a variety of materials so long as the material may be used to align and/or secure the first spacer 655a over the PIC 601. In various cases, the optically transparent adhesive 608 may have a thickness and material that enables light to pass through such as via an optical path 624 from the grating coupler interface portion 602 of the PIC 601 through the first spacer 655a. In one or more examples, the optically transparent adhesive 608 covers a significantly similar portion of the PIC 601 as the first spacer 655a, as shown.

The circuit package 600 includes molding compound layers 612, 622 that are deposited as part of the process of manufacturing the circuit package 600. The molding compounds layers 612, 622 may be made from a variety of materials having various properties. For example, in one or more examples, the molding compounds 612, 622 are epoxy molding compounds in a liquid form that secure elements of the circuit package 600 in place and cover certain elements contained within a structure of the circuit package 600.

The circuit package 600 also includes a second redistribution layer 614 positioned over a top surface of the first spacer 655a. As mentioned above, a redistribution layer may provide any number of connection structures (e.g., electrical interconnects) through which components of the circuit package 600 may communicate. For example, the second redistribution layer 614 includes connections and/or interconnects between the conductive through vias 610 and the hardware components (e.g., the first hardware 616 and the second hardware 618) within the electronic portion (e.g., the electrical layer) of the circuit package 600. The second redistribution layer 614 also includes interconnects 605 (e.g., copper pillars) between the hardware components and the photonic components (e.g., MOD1, MOD2, PD1, and PD2) in the PIC 601.

In the implementation shown in FIG. 6, the second redistribution layer 614 includes an opening above the first spacer 655a, which enables light to pass from above down into the first spacer 655a (and vice versa). The opening in the second redistribution layer 614 may be accomplished in a variety of ways. For example, the second redistribution layer 614 may include a stamped or patterned surface in which openings are left or etched or are otherwise formed over a surface of the second redistribution layer 614 such that light is able to pass through selective portions of the second redistribution layer 614. In this example, an opening is maintained, formed, stamped, or otherwise created at a location on the second redistribution layer 614 to be directly above the location of the first spacer 655a and the grating coupler interface portion 602 within the PIC 601, which enables light to enter and exit the PIC 601 via a corresponding photonic path.

The second spacer 655b is positioned above the first spacer 655a on top of the second redistribution layer 614. Similar to the first spacer 655a, the second spacer 655b provides an optical path 624 through which light can pass. In particular, the second spacer 655b allows light to enter at a top surface of the circuit package 600 (e.g., the top level of the electrical layer).

More specifically, the second spacer 655b is placed over a top surface of the second redistribution layer 614 (e.g., over an opening of the second redistribution layer 614) and over the first spacer 655a such that a photonic path is created between a top current surface of the circuit package 600 and the PIC 601. The second spacer 655b may be made from the same material as spacer 655a, or from a different material or materials.

The circuit package 600 includes regions for connection to a plurality of hardware components (e.g., EICs). For example, a first hardware region 616 is reserved in a portion of the EIC adjacent to a first side of the second spacer 655b while a second hardware region 618 is located in the EIC adjacent to a second side of the second spacer 655b. If the spacer 655b has four sides this could be an opposite side or sides that share a corner. It is shown opposite in FIG. 6, since no third dimension is available.

The first hardware 616 and the second hardware 618 may include similar or different types of hardware. In one or more examples, the first hardware 616 refers to an application-specific integrated circuit (ASIC) chip having been programmed, customized, or otherwise configured for a particular use. The first hardware 616 may also refer to other types of hardware (e.g., electrical hardware components). The second hardware 618 may refer to a similar or different type of hardware as the first hardware 616. For example, in one or more examples, the second hardware 618 refers to a high bandwidth memory (HBM) hardware, a CPU, a GPU, a tensor engine, a neural compute engine, or an AI accelerator. Other implementations may include other types of hardware. In one or more examples, one or both of the hardware components are electronic hardware components.

While not shown in the illustrated example shown in FIG. 6, additional components and layers may be manufactured or otherwise added onto the surface of the circuit package 600. For example, one or more additional distribution layers may be added, and additional circuitry or hardware may be connected having a similar configuration as discussed in connection with any examples discussed herein.

In examples, the spacers 655a-655b are placed over a PIC 601 in a location where light can exit the PIC 601 and be transported through the spacers 655a-655b to another location. In particular, the spacers 655a-655b are located above the grating coupler interface portion 602 of the PIC 601. In this example, the spacers 655a-655b are substantially coplanar (e.g., at or very close to the same level) with the current top of the circuit package 600 or the top surface of an EIC once fabrication is completed.

In some implementations, the circuit package 600 has an optical interface 635 (O/I) attached above the second spacer 655b. The optical interface 635 allows for fibers to be connected to the circuit package 600. Together, the optical interface 635, the spacers 655a-655b, the grating coupler interface portion 602 of the PIC 601 along with portions of the second redistribution layer 614 and optically transparent adhesive 608 form an interface block, as discussed above. Indeed, the interface block allows for an off-chip bidirectional photonic link to be created between the package hardware and external devices.

In general, the EICs of circuit packages described above can be, at least a portion of, a memory device, a computing device, a storage device, or a combination thereof (examples include, but are not limited to, a random-access memory (RAM) device (such as a static RAM (SRAM) device, a magnetic RAM (MRAM) device, a resistive RAM (RRAM) device, or a conductive-bridging or a conductive-bridging RAM (CBRAM) device), a logic device (e.g., an AND, OR, NANO, NOR, or EXOR gate), a NANO flash memory, a solid state drive (SSD) memory, a NOR flash memory, a CMOS memory, a thin film transistor-based memory, a phase-change memory (PCM), a storage class memory (SCM), a magneto-resistive memory (MRAM), a resistive RAM. a DRAM, a high bandwidth memory (HBM), a DOR-based DRAM, a DIMM memory, a CPU, a GPU, an MPU, a tensor engine, a load/store unit (LDSU), a neural compute engine, a dot-product and/or convolution engine, a field programmable gate array (FPGA), an AI accelerator, or any other suitable circuit element. Multiple instances of these devices may be combined on a single die. For example, the EIC can include a memory comprising multiple memory arrays, one or more processors, other logic, communication circuits, and power management functions, and execute instructions stored in the memory array, or otherwise interact with the memory array using the processors on the EIC.

Turning now to detail about manufacturing the circuit package. FIGS. 7-16 illustrate an example series of phases, steps, and/or actions that may be implemented in generating an optically accessible photonic package within the framework of a circuit package.

With reference to FIGS. 7-16 and the accompanying description, it will be appreciated that the order in which the phases are implemented is not intended to be limiting but is described by way of example. For example, other implementations may be performed in a different order or using a different arrangement of components shown in the respective examples. In addition, it will be appreciated that the example circuit package described in connection with FIGS. 7-16 is not intended to be limiting in size or scale of different implementations and the specific proportions shown in the respective figures are provided by way of explanation and are not intended to limit the scope of any particular example to a specific set of dimensions or scale. Some of these example alternatives will be discussed in connection with specific figures.

In addition, while FIGS. 7-16 are described in connection with nine distinct phases of manufacturing the circuit package, it will be appreciated that one or more of these phases may be combined or eliminated in connection with one or more examples. Indeed, the specific phases are described for explanation purposes only and are not intended to limit the scope of manufacture to specific or distinct phases following the discrete stages of manufacture shown in FIGS. 7-16.

Figure 7:
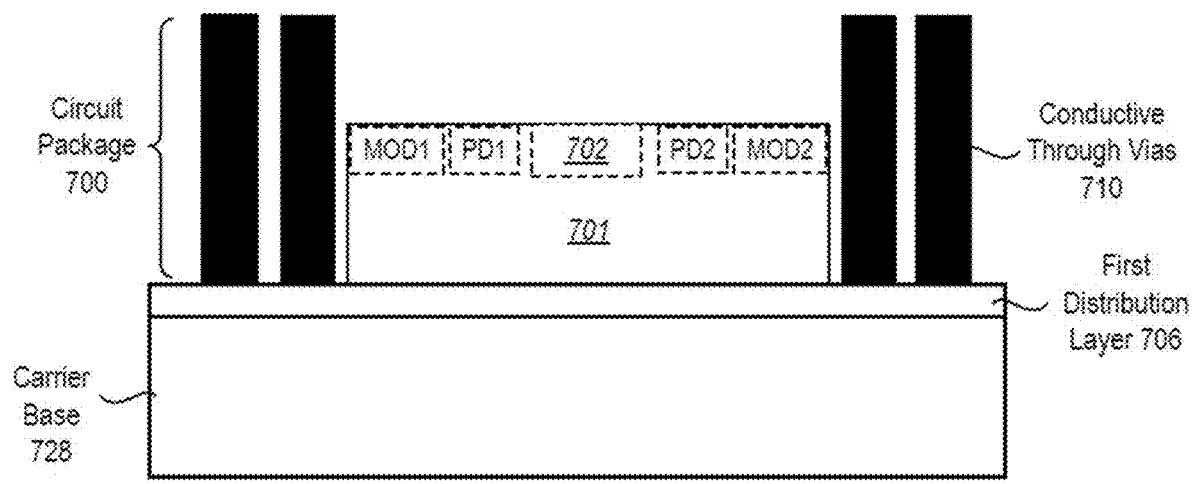
FIG. 7 is a schematic cross-sectional view of a first stage in the fabrication of an example circuit package with co-packaged optics.

FIG. 7 illustrates an example of the first phase of manufacturing a circuit package according to one or more examples described herein. As shown, FIG. 7 includes a carrier base 728 and a circuit package 700 having a PIC 701, a first distribution layer 706, and conductive through vias 710, which are similar to corresponding elements and components introduced above.

In some implementations, the first distribution layer 706 is deposited, layered, or otherwise placed on a top surface of a carrier base. The carrier base 728 may be made from a variety of materials. In some implementations, the carrier base 728 is a glass base. In some implementations, the carrier base 728 is a silicon or polysilicon base layer on which the circuit package 700 is constructed. Indeed, the carrier base 728 may refer to any base material on which the circuit package 700 can be constructed according to one or more examples.

The first distribution layer 706 (and other distribution and/or redistribution layers described herein) may refer to a layer having a variety of thicknesses, which include one or more input/output (I/O) pads that provide availability of electrical elements of the circuit package 700 to other areas of a chip or another circuit package on which the circuit package 700 is to be deposited. The first distribution layer 706 may include wiring, interconnects, and other components that enable components of the circuit package 700 to be electrically coupled to components of one or more additional electronic packages.

As shown in FIG. 7, a PIC 701 is placed on a top surface of the first distribution layer 706. The PIC 701 may refer to a photonic die or bridge die having photonic, electrical, or a combination of electrically and photonically conductive capabilities. For example, as shown in FIG. 7, the PIC 701 includes a grating coupler interface portion 702 where light enters and exits the PIC 701. In addition, the PIC 701 includes optical modulators (MODs) or photo detectors (PDs), as described above.

In some implementations, the PIC 701 includes paths and/or waveguides that enable communication between components of the circuit package 700. In some instances, the PIC 701 is a bridge or an OMIB that can have an intra-package bidirectional photonic path, an inter-package bidirectional-photonic path, or both.

In addition to the first distribution layer 706, the circuit package 700 in FIG. 7 includes conductive through vias 710. As described above, the conductive through vias 710 may be formed using various known methods to produce a through dielectric via or as described in U.S. patent application Ser. No. 18/076,196 entitled "THROUGH-SUBSTRATE VIA FORMED USING A PARTIAL PLUG THAT EXTENDS INTO A SUBSTRATE". The conductive through vias 710 provide electrical interconnectivity between different layers of the circuit package 700 such as power, which can be provided through the vias 710 to provide electrical power to the circuit package. As before, while four conductive pillars are shown, the circuit package 700 may include any number of conductive pillars arranged in various layouts. Further, while FIG. 7 illustrates a side view showing a single row of conductive through vias 710, additional vias may be placed along additional axes (e.g., y-axis, z-axis).

Figure 8:
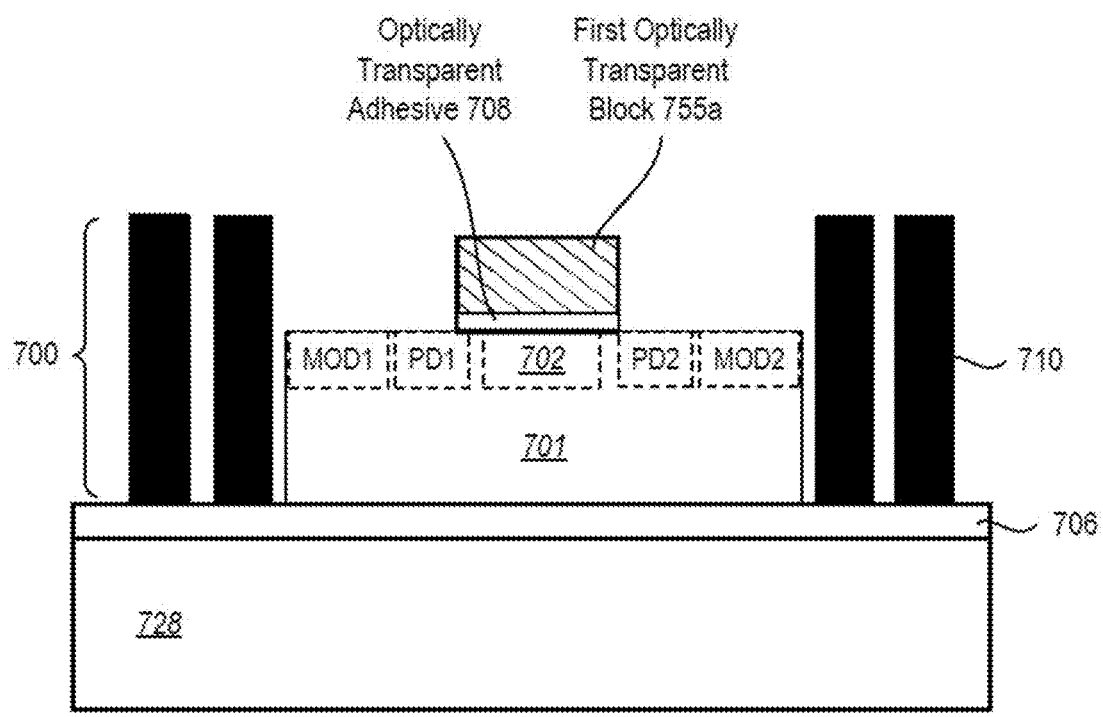
FIG. 8 is a schematic cross-sectional view of a second stage in the fabrication of the example circuit package.

FIG. 8 illustrates an example second phase of manufacturing the circuit package 700 according to one or more examples described herein. FIG. 8 builds upon the components and elements discussed above in connection with FIG. 7. For example, FIG. 8 adds a first spacer 755a placed over a top surface of the first distribution layer 706.

The first spacer 755a may include a variety of optically transparent materials, as described above. In one or more implementations, the first spacer 755a is a glass block that provides optical transparency through which an optical path may pass. In one or more examples, the first spacer 755a is a transparent silicon layer through which light may pass. As noted above, the spacer may be made from a variety of optically transparent materials. In one or more examples, the first spacer 755a is a combination of optically transparent materials, such as a combination of glass and silicon.

While FIG. 8 illustrates an example in which the first spacer 755a is placed, positioned, or provided over a portion of a top surface of the PIC 701 (e.g., directly above the grating coupler interface portion 702 of the PIC 701), the first spacer 755a may cover more or less of the top surface of the PIC 701 than shown in FIG. 8, as described above. In many instances, the first spacer 755a has sides with lengths and widths that match the grating coupler portion or alternatively can have lengths and/or widths that are larger or smaller in magnitude than the grating coupler region. For example, the first spacer 755a is wide enough to cover the grating coupler interface portion 702 of the PIC 701, which is the location on the PIC where the grating couplers are etched and the unidirectional photonic links which allow light to enter and exit the PIC 701 having waveguides designed to connect to the grating couplers in this location. In addition, while FIG. 8 shows an spacer that extends upward to a similar height as the conductive through vias, in one or more examples, the spacer extends further upward, as is the case shown below in FIG. 9.

The first spacer 755a is attached to or otherwise affixed to a top surface of the PIC 701 via an adhesive or other bonding material. In one or more examples described herein, the first spacer 755a (or "first OTB" for short) is affixed to a top surface of the PIC 701 via an optically transparent adhesive 708. The optically transparent adhesive 708 may be made from a variety of materials so long as the material may be used to align and/or secure the first spacer 755a over the PIC 701.

In various implementations, the optically transparent adhesive 708 may have a thickness and material that enables light to pass through such that a portion of photonic path is created through the first spacer 755a to the PIC 701. While FIG. 8 illustrates an example in which the optically transparent adhesive 708 covers a significantly similar portion of the PIC 701 as the first spacer 755a, in one or more implementations, the optically transparent adhesive 708 extends over a larger surface of the PIC 701 than the first spacer 755a.

The first spacer 755a is placed over the grating coupler interface portion 702 in the PIC 701 (e.g., in a location where light can enter and exit the PIC 701. Indeed, the first spacer 755a can receive input light from the PIC 701 via the grating coupler interface portion 702 of the PIC 701.

While FIGS. 7-8 illustrate an example in which a PIC 701 of a circuit package 700 is placed over a first distribution layer 706 and the first spacer 755a is placed over the PIC 701, one or more examples may involve the first spacer 755a and the PIC 701 being connected before either of these elements are placed over the first distribution layer 706. Indeed, in one or more examples, a combined element including both the PIC 701 and the first spacer 755a may be assembled in a parallel process independent from manufacturing other portions of the circuit package 700. In one or more examples, this may be performed to avoid any error in the bonding agent (e.g., the optically transparent adhesive 708) providing an aligned and secure connection between the first spacer 755a and the PIC 701. For example, a combined element including both the first spacer 755a and the PIC 701 may be deposited over the carrier base 728 in a single step.

Figure 9:
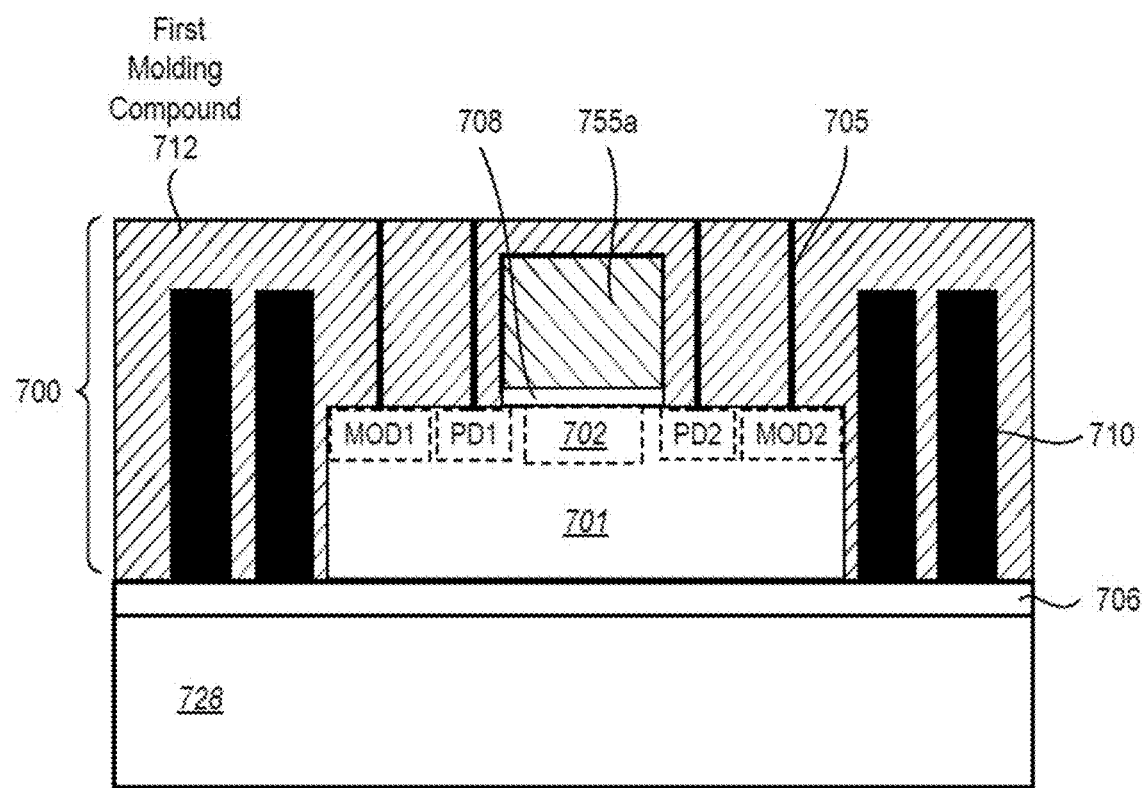
FIG. 9 is a schematic cross-sectional view of a third stage in the fabrication of the example circuit package.

FIG. 9 illustrates an example third phase of manufacturing the circuit package 700 according to one or more examples described herein. As shown in FIG. 9, a first molding compound 712 is added to the circuit package 700. In one or more examples, the first molding compound 712 is deposited over an entirety of the assembled package, as shown in FIG. 9. In this example, the first molding compound 712 covers the entirety of the package including the top surface of the first distribution layer 706, the conductive through vias 710, uncovered portions of the circuit package 700, and the first spacer 755a. In some implementations, the first molding compound 712 may be deposited such that all components are covered except a top surface of the first spacer 755a. In the illustrated example shown in FIG. 9, however, the first spacer 755a is covered by the molding compound.

The first molding compound 712 may be made from a variety of materials having various properties. For example, in one or more examples, the first molding compound 712 is an epoxy molding compound in a liquid form that, when applied, secures elements of the circuit package 700 in place and covers elements contained within a structure of the circuit package 700. Over a period of time, the first molding compound 712 solidifies into a solid form and secures elements in place in preparation for grinding off a layer of the first molding compound 712 and exposing various elements of the circuit package 700, which is further discussed below in connection with FIG. 10.

In some implementations, interconnects 705 are extended partially or fully to the top of the first molding compound 712. For example, the interconnects 705 are copper pillars or another conductive material that form an electrical connection between components in the PIC 701 (e.g., optical modulators (MODs) and photo detectors (PDs)) and components of one or more electronic integrated circuits (e.g., drivers (DRVs) and transimpedance amplifiers (TIAs)) in the electrical layer of the circuit package 700). The interconnects 705 may be added before or after adding the first molding compound 712. In some instances, the interconnects 705 are added after the grinding step, which is discussed next.

Figure 10:
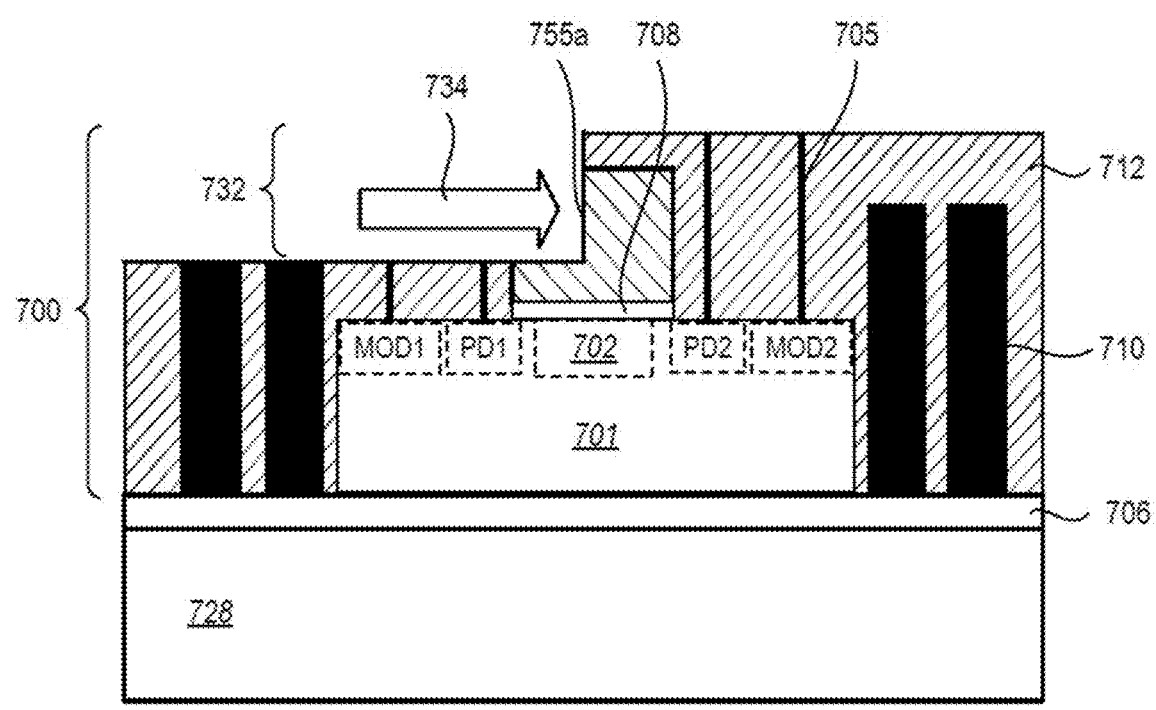
FIG. 10 is a schematic cross-sectional view of a fourth stage in the fabrication of the example circuit package.

FIG. 10 illustrates an example fourth phase of manufacturing the circuit package 700 according to one or more examples described herein. As shown in FIG. 10, a first top layer 732 of the circuit package 700 is removed to expose portions of elements engulfed by the first molding compound 712. For example, as shown in FIG. 10, the first top layer 732 is ground or otherwise removed off the top of the circuit package 700 to expose the top surface of the conductive through vias 710 and the interconnects 705. In addition, the top surface of the first spacer 755a is exposed. In various implementations, the exposed top surface of the conductive through vias 710, the interconnects 705, and/or the first spacer 755a is a new top surface that is different from the original top surface of these elements that was removed in the grinding process.

In examples, the first top layer 732 is ground off using a grinding tool 734 (represented by the block arrow). Other mechanisms suitable for removing layer(s) of the circuit package 700 may be used. In addition, after removing the first top layer 732 of the circuit package 700, a resulting top surface can be smoothed using any of a variety of mechanisms.

The thickness of the layer removed may be variable according to various examples. In one or more examples, the first top layer 732 is removed incrementally as multiple layers are ground off until the top surface of the conductive through vias 710, the interconnects 705 and/or the first spacer 755a are exposed. In one or more examples, a single layer is ground off based on a thickness desired to expose portions of the conductive through vias 710, the interconnects 705 and/or the first spacer 755a. Indeed, as will be discussed below, the thickness of the first top layer 732 may be based on exposing the conductive through vias 710 and/or the interconnects 705 as well as facilitating a photonic path through the circuit package 700 to the PIC 701.

While not shown in FIG. 10, in certain examples, the first spacer 755a may include an additional layer (or have an additional layer deposited thereon) that can be ground by a grinding tool (or exposed in any other suitable manner) in exposing the top surface of the first spacer 755a to establish an optical path through the circuit package 700. This additional layer may provide a guide for grinding to a particular thickness or may simply have optical properties that allow some portion of a light to pass through and allow for optical signals to pass between components of the circuit package 700.

Figure 11:
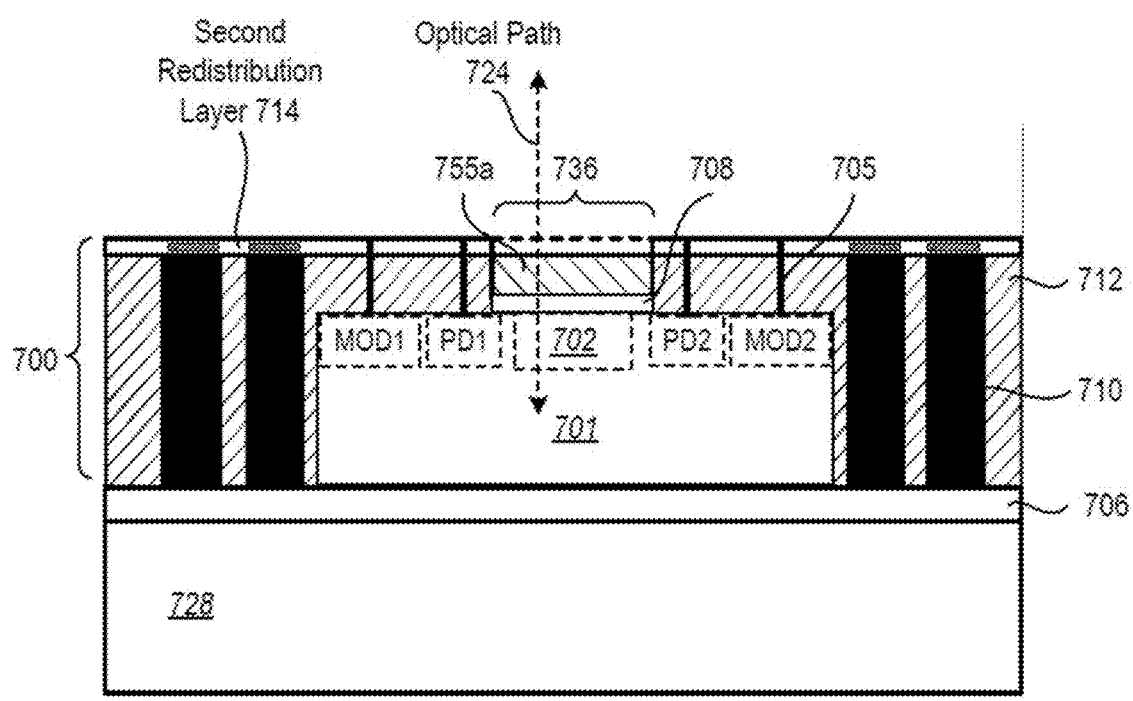
FIG. 11 is a schematic cross-sectional view of a fifth stage in the fabrication of the example circuit package.

FIG. 11 illustrates an example fifth phase of manufacturing the circuit package 700 according to one or more examples. In FIG. 11, the first top layer of the circuit package 700 has been completely removed. As further shown, a second redistribution layer 714 (or distribution layer—a second RDL) is deposited, added, or otherwise placed over the top surface of the ground surface of the circuit package 700.

In this example, the second redistribution layer 714 includes electric interconnects for the vias 710, as described above. The second redistribution layer 714 also includes an opening 736 through which an optical path 724 may exist in providing optical access to the PIC 701. In particular, as shown in FIG. 11, an optical path 724 passes through a portion of the second redistribution layer 714, the first spacer 755a, and the optically transparent adhesive 708 to the PIC 701.

The opening 736 in the second redistribution layer 714 may be accomplished in a variety of ways. For example, in one or more examples, the second redistribution layer 714 may include a stamped or patterned surface in which openings are left or etched or otherwise formed over a surface of the second redistribution layer 714, such that light may pass through selective portions of the second redistribution layer 714 (e.g., the opening 736). In this example, the opening 736 may be maintained, formed, stamped, or otherwise manufactured over the portion of the circuit package 700 corresponding to the placement of the PIC 701.

Figure 12:
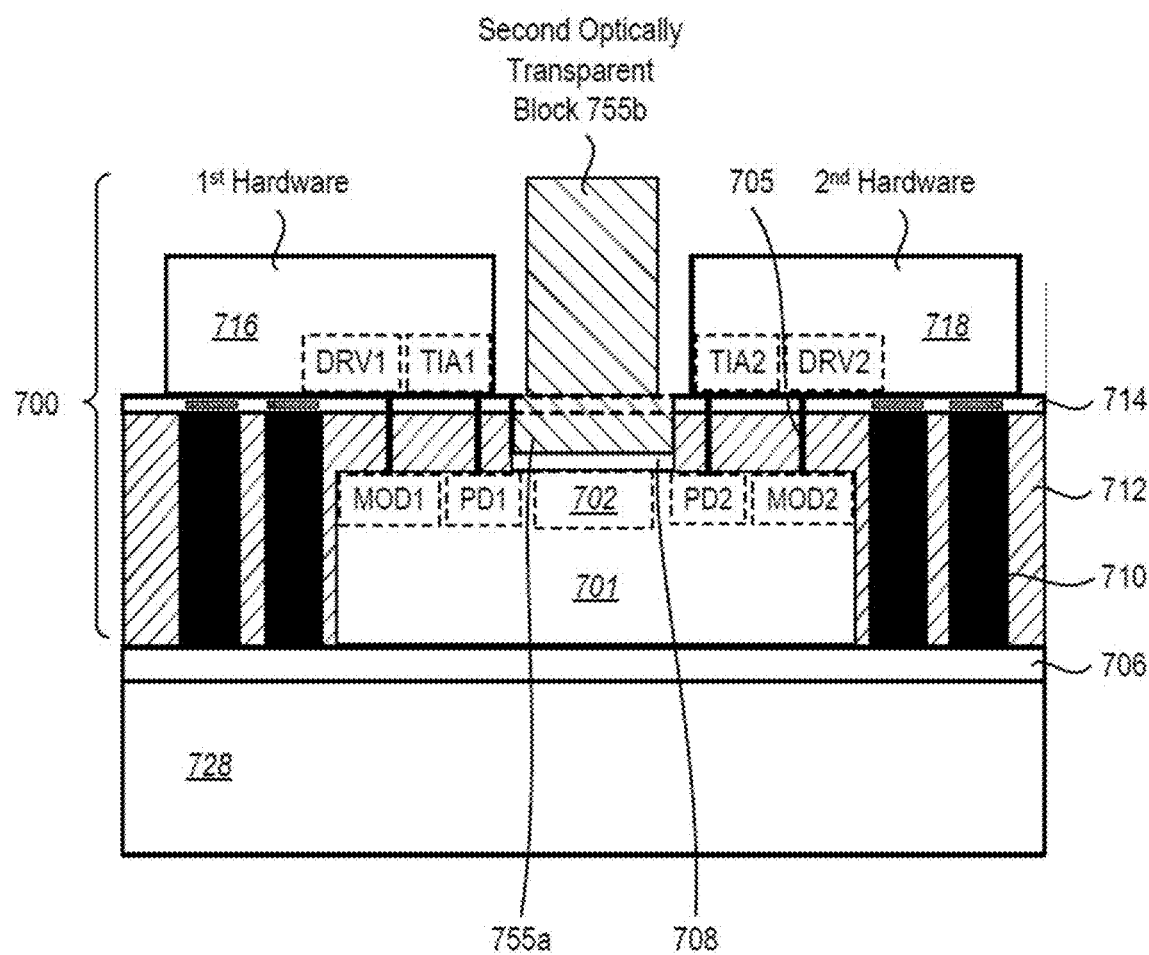
FIG. 12 is a schematic cross-sectional view of a sixth stage in the fabrication of the example circuit package.

FIG. 12 illustrates an example sixth phase of manufacturing the circuit package 700 according to one or more examples. In FIG. 12, additional elements are placed over the top surface of the circuit package 700 shown in FIG. 11. For example, as shown in FIG. 12, a second spacer 755b may be placed over the portion of the second redistribution layer 714 that provides a portion of a photonic path through the circuit package 700. The second spacer 755*b* may be made from a variety of materials and have a variety of features similar to those of the first spacer 755*a* discussed above.

In some examples, the second spacer 755*b* includes one or more lenses positioned to focus light passing via an optical path from the top surface of the circuit package 700 to the PIC 701. The second spacer 755*b* may include multiple lenses in the optical path. The lens(es) may be part of a lens array focusing multiple optical signals between the PIC and multiple, respective optical fibers.

As further shown in FIG. 12, the circuit package 700 includes a plurality of connected hardware. For example, a first hardware 716 may be placed on a first side of the second spacer 755*b* (e.g., any of its four sides if shaped as a four-sided object). As shown in FIG. 12, the first hardware 716, which includes a driver (DRV1) and a transimpedance amplifier (TIA1), is connected to the PIC 701 via one or more of the interconnects 705. In addition to the first hardware 716, a second hardware 718 may be placed on a second side of the second spacer 755*b*. (e.g., opposite the first side or adjacent the first side). As shown in FIG. 12, the second hardware 718, which includes a driver (DRV2) and a transimpedance amplifier (TIA2), is connected to the PIC 701 via one or more of the interconnects 705.

The first hardware 716 and the second hardware 718 may include similar or different types of hardware. In one or more examples, the first hardware 716 refers to an application-specific integrated circuit (ASIC) chip having been programmed, customized, or otherwise configured for a particular use. The first hardware 716 may also refer to other types of hardware (e.g., electrical hardware components). The second hardware 718 may refer to a similar or different type of hardware as the first hardware 716. For example, in one or more examples, the second hardware 718 refers to a high bandwidth memory (HBM) hardware, a CPU, a GPU, a tensor engine, a neural compute engine, or an AI accelerator. Other implementations may include other types of hardware. In one or more examples, one or both of the hardware components are electronic hardware components. In one or more examples, one or both of the hardware components are photonic hardware components.

Figure 13:
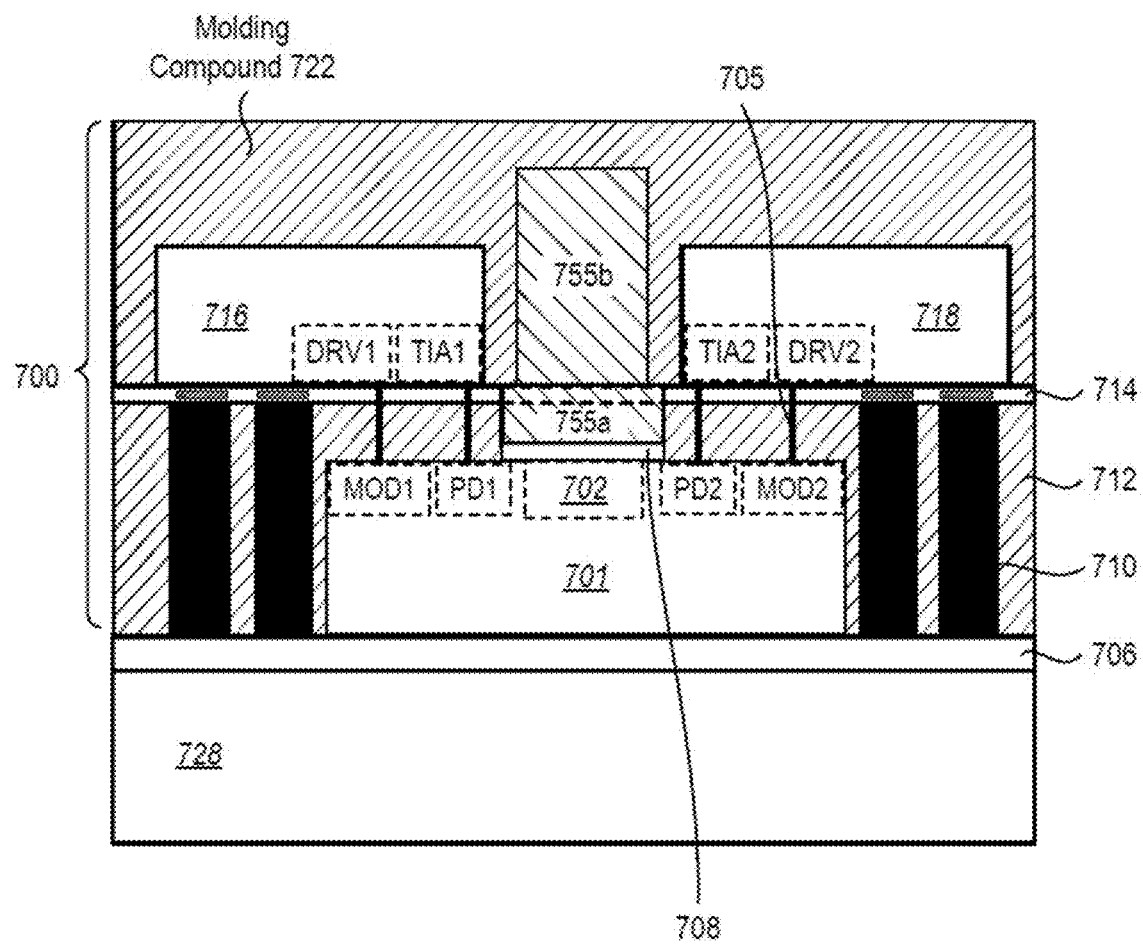
FIG. 13 is a schematic cross-sectional view of a seventh stage in the fabrication of the example circuit package.

FIG. 13 illustrates an example seventh phase of manufacturing the circuit package 700 according to one or more examples. In this figure, a second molding compound 722 has been applied to the circuit package 700. As shown in FIG. 13, the second molding compound 722 may cover both the first hardware 716 and the second hardware 718 as well as the second spacer 755*b*. The second molding compound 722 may include similar features and characteristics as the first molding compound 712 discussed above in connection with FIG. 9. Alternatively, in one or more examples, the second molding compound 722 may include different materials and other properties depending on the purposes of a particular example.

Figure 14:
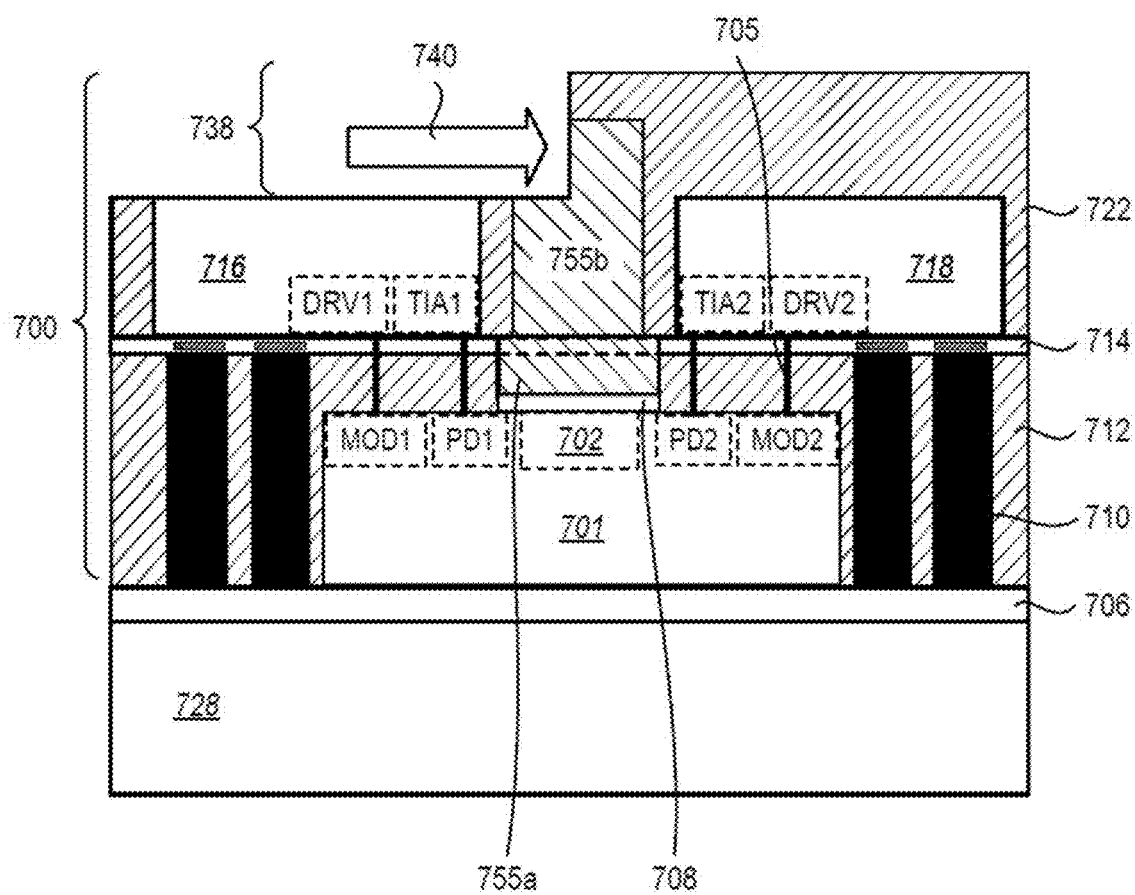
FIG. 14 is a schematic cross-sectional view of a eighth stage in the fabrication of the example circuit package.

FIG. 14 illustrates an example eighth phase of manufacturing the circuit package 700 according to one or more examples. In this example illustration, a second top layer 738 is ground off the top of the circuit package 700 (or otherwise removed) using a grinding tool 740 (the same or different grinding tool as introduced above) to expose a top of the second spacer 755*b*. In one or more examples, the top of the first hardware 716 and/or the second hardware 718 are optionally exposed. After grinding (or otherwise removing) the second top layer 738, the top of the second spacer 755*b* is exposed to allow for a portion of a photonic path to travel through the circuit package 700 to the hardware components connected to the PIC 701.

Figure 15:
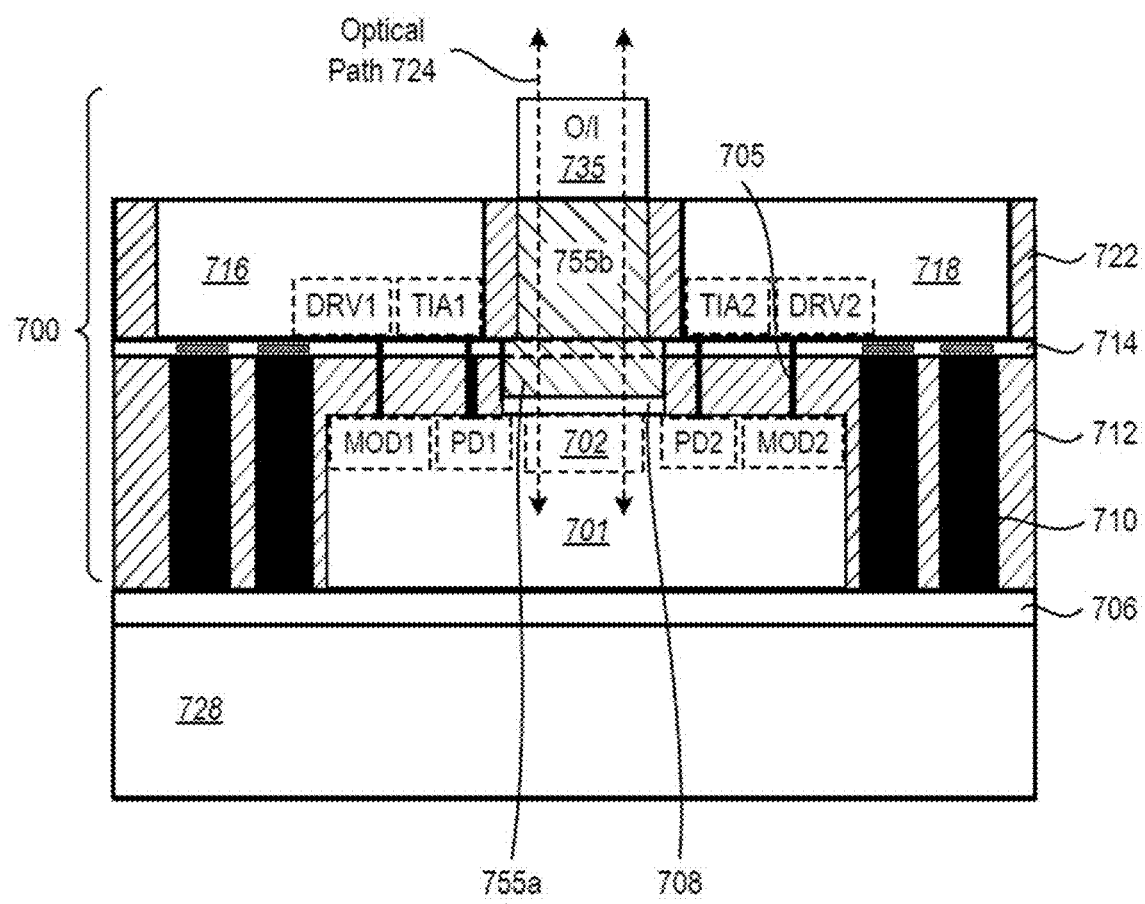
FIG. 15 is a schematic cross-sectional view of a ninth stage in the fabrication of the example circuit package.

FIG. 15 illustrates an example ninth phase in which an optical interface 735 (I/O) is added to the circuit package 700. As shown, the optical interface 735 is connected to a top surface of the second spacer 755*b* in a top portion of the circuit package 700. In particular, the optical interface 735 is located on a surface above an electrical layer of the circuit package 700 (e.g., an electrical portion that includes the first hardware 716 and the second hardware 718) directly above the transparent window. It should be noted that the diagrams are 2-dimensional for convenience. The transparent window, grating coupler regions, optical interfaces extend into the z-dimension and form 2 dimensional regions where these components are placed.

As described above, the optical interface 735 allows the circuit package 700 to connect to fibers and other optical connections. The fibers can connect to external devices, including light engines, memory devices, processing devices, and other circuit packages.

In various implementations, the optical interface 735, the spacers 755*a*-755*b*, the grating coupler interface portion 702 of the PIC 701 along with portions of the second redistribution layer 714 and optically transparent adhesive 708 form an interface block, as discussed above. Indeed, the interface block allows for an off-chip bidirectional photonic link to be created between the package hardware and external devices. In various implementations, the bidirectional photonic path (or one or more unidirectional photonic links in each direction) allows the external devices to transmit modulated light to the PIC 701.

Indeed, the circuit package 700 enables unidirectional photonic links that connect external components with hardware components (e.g., the first hardware 716 and the second hardware 718). For example, light enters (and exits) the circuit package 700 at the optical interface 735, passes through the spacers, and enters (or exits) the PIC 701 via the grating coupler interface portion 702 of the PIC 701. Additionally, multiple unidirectional photonic links in each direction may make up a bidirectional photonic path that is routed through the interface block of the circuit package 700.

While not shown in the illustrated examples shown in FIGS. 7-15, additional components and layers may be manufactured onto the surface of the circuit package 700. For example, one or more additional distribution layers may be added, and additional circuitry or hardware may be connected similarly as discussed with one or more of the manufacturing stages discussed above in connection with FIGS. 7-15.

Figure 16:
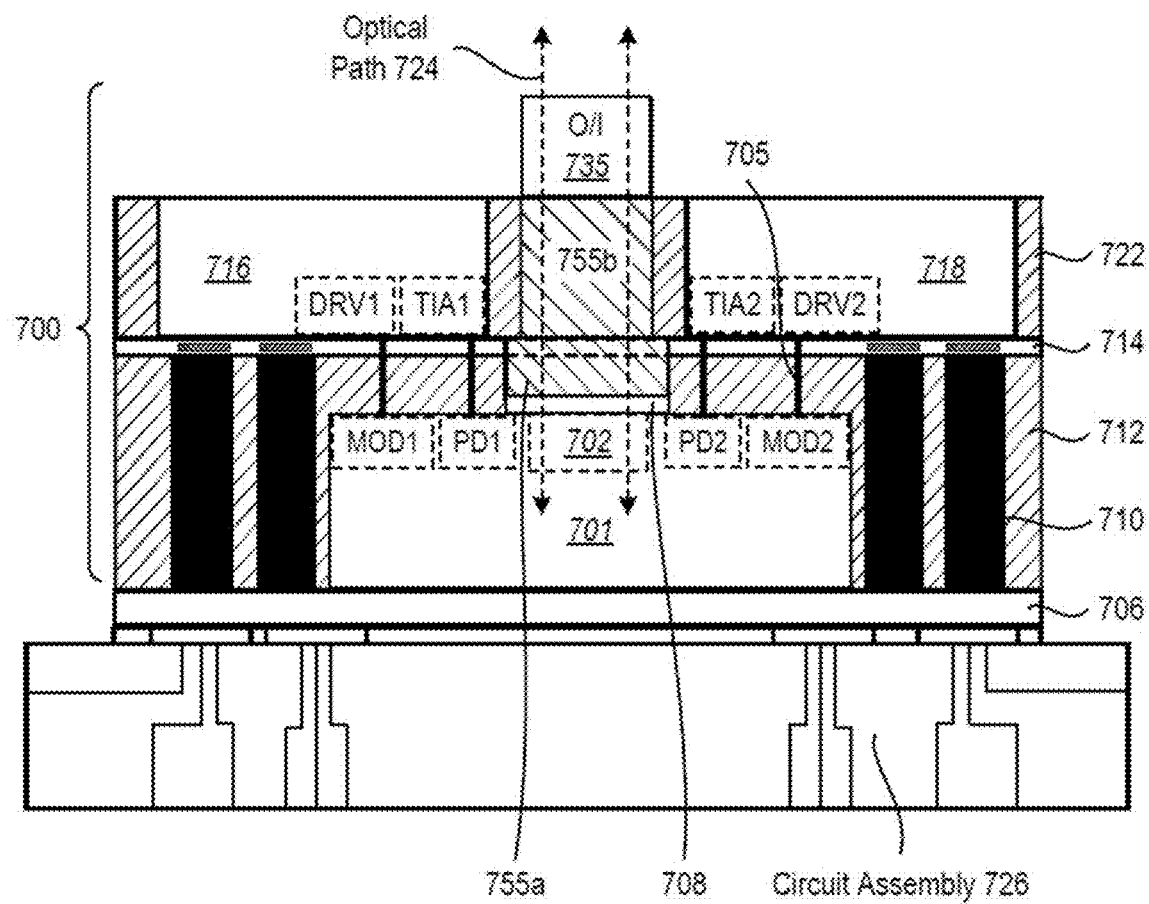
FIG. 16 is a schematic cross-sectional view of a tenth stage in the fabrication of the example circuit package.

FIG. 16 illustrates an example tenth phase in which the circuit package 700 is connected to or otherwise coupled to the circuit assembly 726. In this example, the circuit package 700 is removed from the carrier base and attached to a new base including a circuit assembly. In one or more examples, by connecting the circuit package 700 to the circuit assembly 726, components of the circuit package 700 are coupled to one or more additional components, subcomponents, chips, or other hardware modules of the circuit assembly 726.

While FIGS. 7-16 illustrate an example set of phases for manufacturing or otherwise generating a circuit package 700, other implementations may be used.

Figure 17:
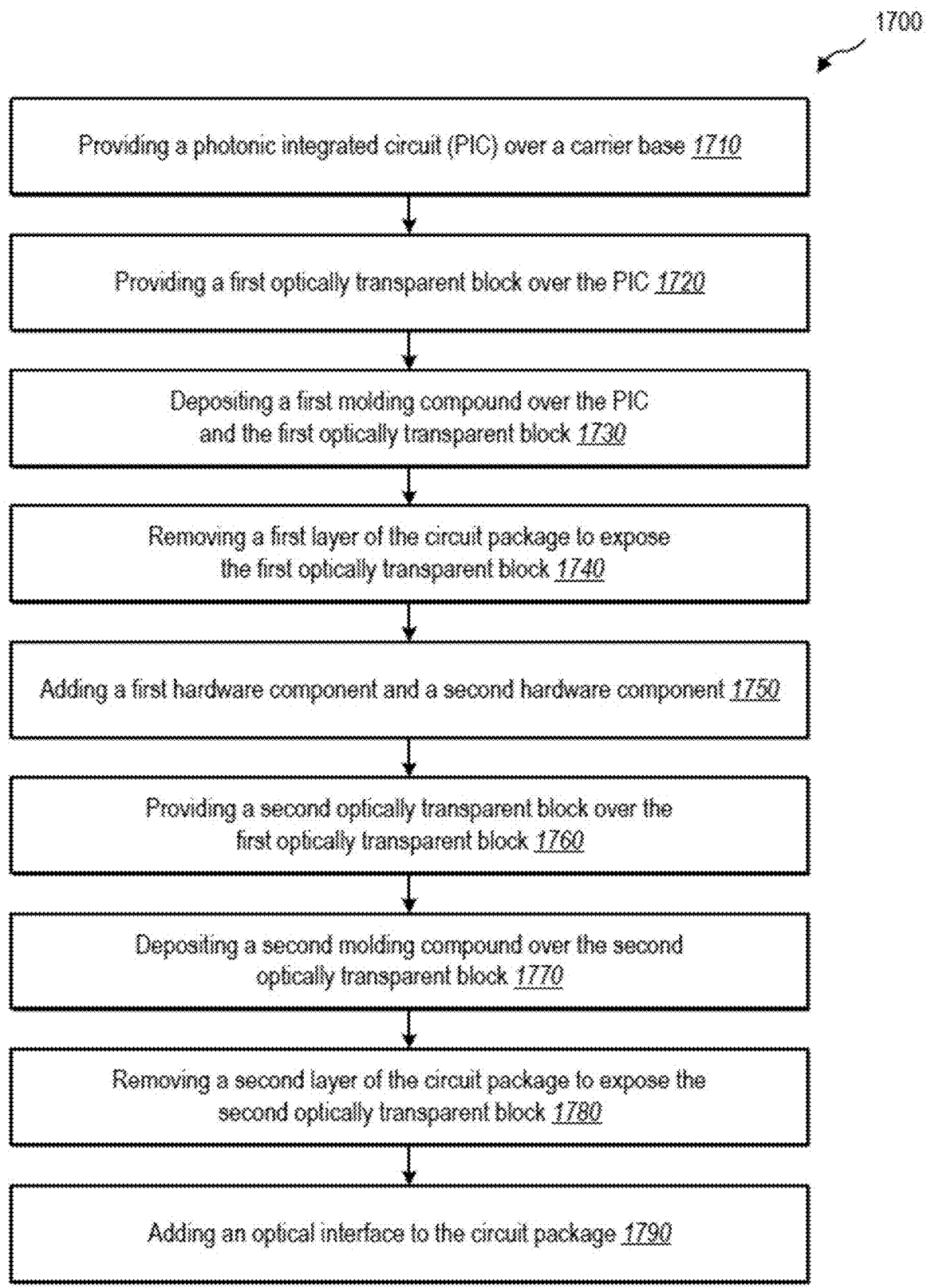
FIG. 17 is a flow chart showing a series of steps for an example method for manufacturing and/or fabricating a circuit package with co-packaged optics.

Turning now to FIG. 17, this figure illustrates an example series of steps 1700 for a method for manufacturing and/or producing a circuit package according to one or more examples. In particular, FIG. 17 includes an example flow-chart including a series of steps for manufacturing and implementing a circuit package 700 according to one or more examples described herein. While FIG. 17 illustrates steps according to one or more examples, alternative examples may omit, add to, reorder, and/or modify any of the steps shown in FIG. 17. The steps of FIG. 17 may be performed as part of a method (e.g., a method for manufacturing a circuit package). In one or more examples, one or more machines may perform one or more of the steps of FIG. 17 with the aid of a processor(s) and computing device(s).

It will be appreciated that, similar to the implementation discussed above in connection with FIGS. 7-16, the series of steps illustrated in FIG. 17 are provided as an example implementation and is not intended to limit the circuit package 700 or specific components thereof to a specific example. Moreover, it will be understood that any of the features discussed in connection with FIGS. 7-16 may be implemented within the flow diagram of FIG. 17 and, conversely, any of the features described in connection with FIG. 17 may be similarly implemented within the examples shown and described in connection with FIGS. 7-16.

The series of steps 1700 includes step 1710 of placing a photonic integrated circuit (PIC) over a carrier base. For instance, step 1710 involves placing a photonic integrated circuit (PIC) over a carrier base, the PIC including one or more photonic channels.

As further shown, the series of steps 1700 includes step 1720 of placing a first spacer over the PIC. For instance, step 1720 involves placing a first spacer over a portion of the PIC.

As further shown, the series of steps 1700 includes step 1730 of depositing a first molding compound over the PIC and the first spacer. For instance, step 1730 involves depositing a first molding compound over the PIC and the first spacer, the first molding compound covering a top surface of the first spacer.

As further shown, the series of steps 1700 includes step 1740 of removing a first layer of the circuit package to expose the first spacer. For instance, step 1740 involves removing a first top layer of the circuit package to expose the first spacer.

As further shown, the series of steps 1700 includes step 1750 of adding a first hardware component and a second hardware component. For instance, step 1750 involves adding a first hardware component to a first side of the first spacer and a second hardware component to a second side of the first spacer opposite of the first side.

As further shown, the series of steps 1700 includes step 1760 of placing a second spacer over the first spacer. For instance, step 1760 involves placing a second spacer over a portion of the first spacer.

As further shown, the series of steps 1700 includes step 1770 of depositing a second molding compound over the second spacer. For instance, step 1770 involves depositing a second molding compound over the second spacer, the second molding compound covering a top surface of the second spacer.

As further shown, the series of steps 1700 includes step 1780 of removing a second layer of the circuit package to expose the second spacer. For instance, step 1780 involves removing a second top layer of the circuit package to expose the second spacer, wherein removing the second top layer creates an optical path between a new top surface of the second spacer and the PIC.

As further shown, the series of steps 1700 includes step 1790 of adding an optical interface to the circuit package.

For instance, step 1780 involves connecting an optical interface to the new top surface of the second spacer of the circuit package. In various instances, the optical interface is added at a level that is coplanar with the surface of the electrical layer in the circuit package.

In some implementations, the one or more photonic channels are one or more bidirectional channels. In some implementations, the one or more photonic channels within the PIC are within a photonic die of the PIC. In some implementations, placing the first spacer over the portion of the PIC includes connecting the first spacer to the PIC using an optically transparent adhesive. In some implementations, placing the first spacer over the portion of the PIC includes connecting the first spacer to the PIC using an optically transparent adhesive. In some implementations, the optical interface is added to the new top surface of the second spacer in a location that is directly over the grating coupler in the PIC.

In some implementations, the optically transparent adhesive extends over a larger surface of the PIC than the first spacer. In some implementations, the first spacer and the PIC are first combined before being deposited over the carrier base. In some implementations, the first molding compound is an epoxy molding compound applied in liquid form and solidifies into a solid form. In some respects, the techniques described herein relate to a method, further including adding conductive pillars within the circuit package over the carrier base.

In some implementations, the first molding compound covers a top surface of a first distribution layer attached to the carrier base, the conductive pillars, and the first spacer. In some implementations, removing the first top layer of the circuit package includes grinding off portions of the first molding compound and the first spacer from the circuit package. In some implementations, removing the first top layer of the circuit package exposes a new top surface of the first spacer that is different from the top surface of the first spacer.

In some implementations, adding the first hardware component to a first side of the first spacer includes connecting the first hardware component to a first end of the PIC using a first photonic channel of the one or more photonic channels. In some implementations, adding the first hardware component to a first side of the first spacer includes connecting a driver in the first hardware component to an electro-absorption modulator (EAM) in the PIC using a first copper pillar. In some implementations, adding the first hardware component to a first side of the first spacer includes connecting a transimpedance amplifier (TIA) in the first hardware component to a photo detector (PD) in the PIC using a second copper pillar.

In some implementations, placing the second spacer over a portion of the first spacer includes attaching the second spacer to the first spacer via a second redistribution layer. In some implementations, the second redistribution layer includes an opening that is aligned with the second spacer and the first spacer such that the optical path passes through the opening of the second redistribution layer. In some implementations, the PIC includes one or more waveguides to transmit light signals through the PIC.

In some implementations, the first molding compound is the same material as the second molding compound. In some implementations, the first molding compound is a different material as the second molding compound. In some implementations, removing the first top layer of the circuit package includes grinding off portions of the first molding compound and the first spacer from the circuit package.

In some implementations, removing the second top layer of the circuit package exposes the new top surface of the second spacer that is different from the top surface of the second spacer. In some implementations, the optical path between the new top surface of the second spacer and the PIC passes through the first spacer. In some implementations, the optical path between the new top surface of the second spacer and the PIC passes through a second redistribution layer connecting the second spacer to the first spacer and an optically transparent adhesive connecting the first spacer to the PIC.

In some implementations, the series of steps 1700 also includes removing the circuit package from the carrier base after removing the second top layer of the circuit package and connecting the circuit package to a circuit assembly. In some implementations, the first spacer is a glass block, an optically transparent silicon block, or a block including a combination of glass and optically transparent silicon.

In some implementations, the second spacer includes an array of multiple lenses. In some implementations, the second spacer includes at least one lens having a configuration that focuses an optical signal that passes through the second spacer.

In some implementations, the series of steps 1700 includes obtaining a base structure including a carrier base layer and a plurality of conductive pillars positioned on an upper surface of the carrier base layer. In some implementations, the series of steps 1700 includes placing a circuit package element over the carrier base layer. In some implementations, the series of steps 1700 includes placing an optically transparent blank silicon block over at least a portion of the circuit package element maintaining an optical path from the circuit package element to a top surface of the optically transparent blank silicon block.

In some implementations, the series of steps 1700 includes depositing a first molding compound over the circuit package element and over at least a portion of the blank silicon block and conductive pillars. In some implementations, the series of steps 1700 includes grinding off a layer of the molding compound to create a first grinded surface where portions of the conductive pillars and optically transparent blank silicon block are accessible via the first grinded surface.

In some implementations, the series of steps 1700 includes adding one or more redistribution layers over the first grinded surface. In some implementations, the series of steps 1700 includes placing a first electrical hardware over the one or more redistribution layers to be positioned over a first end of the circuit package element and coupling the first electrical hardware to a bidirectional channel within the circuit package element. In some implementations, the series of steps 1700 includes placing a second electrical hardware over the one or more redistribution layers to be positioned over a second end of the circuit package element and coupling the second electrical hardware to the bidirectional channel within the circuit package element. In some implementations, the series of steps 1700 includes placing an optically transparent lens block over a portion of the circuit package element maintaining an optical path from the circuit package element to a top surface of the optically transparent blank silicon block.

One or more specific examples of the present disclosure are described herein. These described examples are examples of the presently disclosed techniques. Additionally, in an effort to provide a concise description of these examples, not all features of an actual example may be described in the specification. It should be appreciated that in the development of any such actual implementation, as in any engineering or design project, numerous example-specific decisions will be made to achieve the developers' specific goals, such as compliance with system-related and business-related constraints, which may vary from one example to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one example" or "an example" of the present disclosure are not intended to be interpreted as excluding the existence of additional examples that also incorporate the recited features. For example, any element described in relation to an example herein may be combinable with any element of any other example described herein. Numbers, percentages, ratios, or other values stated herein are intended to include that value, and also other values that are "about" or "approximately" the stated value, as would be appreciated by one of ordinary skill in the art encompassed by examples of the present disclosure. A stated value should therefore be interpreted broadly enough to encompass values that are at least close enough to the stated value to perform a desired function or achieve a desired result. The stated values include at least the variation to be expected in a suitable manufacturing or fabrication process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to examples disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the examples that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics.

The described examples are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An integrated circuit package, comprising:
a first electrical integrated circuit (EIC) comprising an analog-mixed signal (AMS) block, the AMS block comprising a driver;
a photonic integrated circuit (PIC) comprising an electro-absorption modulator (EAM), an optical coupling element at a surface of the PIC, and one or more waveguides, the first EIC being flip-chip bonded to the surface of the PIC overlapping a portion of the PIC, the EAM being located in the portion of the PIC overlapped by the first EIC with the AMS block overlapping the EAM, the EAM being electrically connected to the EAM, and the optical coupling element being in another portion of the PIC not overlapped by the first EIC;
a spacer protruding from the surface of the PIC in the other portion of the PIC not overlapped by the first EIC, the spacer being transparent for light in an operative wavelength band of the PIC,
wherein the transparent spacer is positioned over the optical coupling element, and the transparent spacer, optical coupling element, and one or more waveguides provide a first optical path through the package to the active element for light in the operative wavelength band.

2. The package of claim 1, further comprising a second EIC attached to the surface of the PIC and overlapping a further portion of the PIC not overlapped by the first EIC or the spacer.

3. The package of claim 2, wherein the spacer is located between the first EIC and the second EIC.

4. The package of claim 3, wherein the first EIC overhangs a first edge of the PIC and the second EIC overhangs a second edge of the PIC opposite the first edge.

5. The package of claim 1, wherein a surface of the first EIC opposite the PIC and a surface of the spacer opposite the PIC are offset in a direction normal to the surface of the PIC by 10 µm or less.

6. The package of claim 5, wherein the surface of the first EIC and the surface of the spacer are substantially coplanar.

7. The package of claim 6, further comprising an optical interface for an optical fiber affixed to the surface of the spacer.

8. The package of claim 7, wherein the optical interface overlaps the surface of the first EIC.

9. The package of claim 7, wherein the optical interface comprises a fiber array unit (FAU).

10. The package of claim 1, further comprising an optical interface affixed to the spacer on a surface of the spacer opposite the PIC, the optical interface comprising a connector for receiving at least one optical fiber and one or more optical elements arranged to direct light in the operative wavelength band from the optical fiber to the optical coupling element.

11. The package of claim 10, wherein the optical interface comprises a polarizing beam splitter for splitting an optical signal into a pair of signals having orthogonal polarization states prior to the pair of optical signals entering the PIC or for combining a pair of orthogonal polarized optical signals exiting the PIC.

12. The package of claim 10, wherein the one or more optical elements comprise at least one focusing element for focusing light through the spacer to the optical coupling element.

13. The package of claim 10, wherein the optical interface comprising an array of lenses, at least one of the lenses in the array corresponding to the one or more optical elements arranged to direct the light in the operative wavelength band from the optical fiber to the optical coupling element.

14. The package of claim 1, wherein the spacer is spaced from the first EIC by 50 µm or more.

15. The package of claim 1, wherein the spacer is composed of a material selected from the group consisting of Ge, Si, ZnS, ZnSe, AlO, and MgF.

16. The package of claim 1, wherein the spacer is composed of an amorphous inorganic material.

17. The package of claim 1, wherein the spacer comprises one or more portions of a transparent material bonded to the surface of the PIC.

18. The package of claim 17, wherein the one or more portions are bonded to the surface of the PIC with a transparent adhesive.

19. The package of claim 1, further comprising a redistribution layer (RDL) electrically connected to the first EIC, the RDL comprising an opening aligned with the spacer.

20. The package of claim 1, wherein the PIC further comprises a demultiplexer in the optical path between the optical coupling element and the EAM.

21. The package of claim 1, wherein the PIC further comprises a multiplexer in the optical path between the optical coupling element and the EAM.

22. The package of claim 1, wherein the optical path is part of a bidirectional photonic channel between the first EIC and a component external to the package, the bidirectional photonic channel comprising the first optical path and a second optical path between another optical coupling element and a photodiode.

23. The package of claim 1, wherein the first EIC comprises an application-specific integrated circuit (ASIC).

24. The package of claim 1, wherein the first EIC comprises a memory interface.

25. The package of claim 1, wherein the operative wavelength band comprises a C-band.

26. The package of claim 1, further comprising a molding compound at least partially encapsulating the PIC, the EIC, and the spacer.

27. The package of claim 26, wherein at least some of the molding compound is located between the EIC and the spacer.

28. The package of claim 26, wherein a surface of the molding compound is coplanar with a surface of the spacer opposite the PIC.

29. An integrated circuit package, comprising:
a first electrical integrated circuit (EIC) comprising an analog-mixed signal (AMS) block, the AMS block comprising a driver;
a photonic integrated circuit (PIC) comprising an electro-absorption modulator (EAM), an optical coupling element at a surface of the PIC, and one or more waveguides, the first EIC being flip-chip bonded to the surface of the PIC overlapping a portion of the PIC, the EAM being located in the portion of the PIC overlapped by the first EIC with the AMS block overlapping the EAM, the active element being electrically connected to the EAM, and the optical coupling element being in another portion of the PIC not overlapped by the first EIC;

a spacer protruding from the surface of the PIC in the other portion of the PIC not overlapped by the first EIC, the spacer being transparent for light in an operative wavelength band of the PIC;

a molding compound at least partially encapsulating the PIC and the transparent spacer, a surface of the molding compound being coplanar and continuous with a surface of the spacer opposite the PIC; and wherein the transparent spacer is positioned over the optical coupling element, and the transparent spacer, optical coupling element, and one or more waveguides provide a first optical path through the package to the active element for light in the operative wavelength band.

* * * * *